(12) United States Patent
Nicholls et al.

(10) Patent No.: US 12,323,101 B2
(45) Date of Patent: Jun. 3, 2025

(54) PHASE LOCKED OSCILLATOR AND METHOD

(71) Applicant: Nanowave Technologies Inc., Etobicoke (CA)

(72) Inventors: Charles William Tremlett Nicholls, Ottawa (CA); Daniel Raymond Grise, Ottawa (CA)

(73) Assignee: Nanowave Inc., Etobicoke (CA)

( * ) Notice: Subject to any disclaimer, the term of this patent is extended or adjusted under 35 U.S.C. 154(b) by 0 days.

(21) Appl. No.: 18/551,908

(22) PCT Filed: Mar. 28, 2022

(86) PCT No.: PCT/CA2022/050461
§ 371 (c)(1),
(2) Date: Sep. 22, 2023

(87) PCT Pub. No.: WO2022/198339
PCT Pub. Date: Sep. 29, 2022

(65) Prior Publication Data
US 2024/0171126 A1    May 23, 2024

Related U.S. Application Data

(60) Provisional application No. 63/166,560, filed on Mar. 26, 2021.

(51) Int. Cl.
*H03B 5/04* (2006.01)
*H03L 7/099* (2006.01)
(52) U.S. Cl.
CPC ............... *H03B 5/04* (2013.01); *H03L 7/099* (2013.01); *H03B 2200/009* (2013.01)

(58) Field of Classification Search
CPC .................................................... H03B 5/04
(Continued)

(56) References Cited

U.S. PATENT DOCUMENTS 5,740,521 A    4/1998  Hulkko et al.
7,061,330 B2   6/2006  Kegasa et al.
(Continued)

OTHER PUBLICATIONS

International Patent Application No. PCT/CA2022/050461 International Preliminary Report on Patentability, dated Oct. 5, 2023.
(Continued)

*Primary Examiner* — Joseph Chang
(74) *Attorney, Agent, or Firm* — Borden Ladner Gervais

(57) ABSTRACT

An oscillator and method for maintaining a phase lock is provided. The oscillator may include an oscillator input port for receiving a reference signal, an oscillator output port for outputting an oscillator output, an unlocked oscillator oscillating in an unlocked state and outputting at a resonance frequency configured to drift in response to changes in an operating environment, and a phase locked loop (PLL) including a mixer having an output port configured to output the unlocked oscillator output mixed with a local oscillator output, the mixer output port in communication with a phase frequency detector and the oscillator output port, and the phase frequency detector generating a control signal based on a detected phase difference between the reference signal and the mixer output wherein the control signal adjusts the local oscillator output to compensate for the resonance frequency drift of the unlocked oscillator when mixed with the unlocked oscillator output.

17 Claims, 19 Drawing Sheets

(58) Field of Classification Search
USPC .......................................................... 331/1 R
See application file for complete search history.

(56) References Cited

U.S. PATENT DOCUMENTS

| | | |
|---|---|---|
| 2004/0183604 A1 | 9/2004 | Ammar et al. |
| 2007/0013451 A1 | 1/2007 | Luzzatto et al. |
| 2012/0074993 A1* | 3/2012 | Chen .................... H03L 1/00 |
| | | 327/147 |
| 2014/0015572 A1 | 1/2014 | Nicholls et al. |
| 2016/0365865 A1 | 12/2016 | Nicholls et al. |
| 2020/0162084 A1* | 5/2020 | Darabi .................. H03L 7/099 |

OTHER PUBLICATIONS

International Patent Application No. PCT/CA2022/050461 International Search Report and Written Opinion dated Jun. 8, 2022.
Brumbi, "Low Power Fmcw Radar System for Level Gaging," Microwave Symposium Digest, IEEE MTT-S, 2000, vol. 3, 1559-1562.
European Patent Application No. 22773860.6, Extended European Search Report dated Jan. 8, 2025.
European Patent Application No. 22773860.6, Office Action dated Jan. 28, 2025.

* cited by examiner

PHASE LOCKED OSCILLATOR AND METHOD

FIELD

The present disclosure relates generally to oscillators and methods for maintaining phase lock and more particularly to maintaining optimal phase noise under phase lock and even more particularly to maintaining optimal phase noise under phase lock in response to changes in the operating environment and even more particularly to maintaining optimal phase noise under phase lock over a wide temperature range and/or mechanical vibration.

BACKGROUND

Radio systems consist of reception and transmission equipment. A fundamental requirement of such equipment is to instantiate information on the radio transmission signal in the case of the transmitter, and to recover the information in the case of the receiver. Frequency conversion between the information signal and the radio frequency channel is achieved through a process of frequency conversion in which a stable local oscillator signal operating at the frequency of the radio channel is used to convert the information signal between the information channel and the radio channel.

Oscillators having low phase noise are desirable for radio equipment including telecommunications, RADAR, and electromagnetic sensor systems. Phase noise represents the random fluctuation in signal phase with time, and results in a reduction in detection sensitivity of the system in which the oscillator is used. In the case of RADAR, reducing phase noise improves system sensitivity, resulting in increased operational range or reduction of the minimum detectable target scattering cross section. In the case of a telecommunications system, reducing phase noise results in: increased maximum data rate; reduction in the bit error rate; and an increase in the number of channels that can be placed in a specified bandwidth by virtue of the reduction in the guard band requirements.

Conventional dielectric resonator oscillators (DRO) include a mechanical screw for setting the center frequency of the oscillator and a phase shift element for adjusting an operational state of the DRO to maintain phase lock with an external reference. When using the DRO in extreme environments, typically a hermetic seal is applied to the DRO to achieve optimum reliability, practically making the mechanical screw inaccessible. However, environmental stimulus such as temperature changes and mechanical vibrations can cause the operational state of the DRO to drift from its center frequency. In the case that the oscillator is locked to a frequency stable reference the oscillation frequency will be maintained at the required frequency by adjusting the phase shift element. The phase shift element will account for the phase change resulting from the change in the resonator phase caused by the environment. The result is that oscillation will be maintained at a frequency that is different from the resonator center frequency leading to an increase in insertion loss and phase noise. Phase noise increase will result from the decrease in the phase gradient with frequency that results from operation at a frequency offset from the resonance frequency. Significant engineering efforts are generally required to maintain the DRO in phase lock with the external reference over a wide temperature range, while also maintaining acceptable levels of phase noise.

Improvements in RADAR and telecommunication systems and oscillators are desirable.

BRIEF DESCRIPTION OF THE DRAWINGS

Embodiments of the present disclosure will now be described, by way of example only, with reference to the attached Figures.

Figure 1:
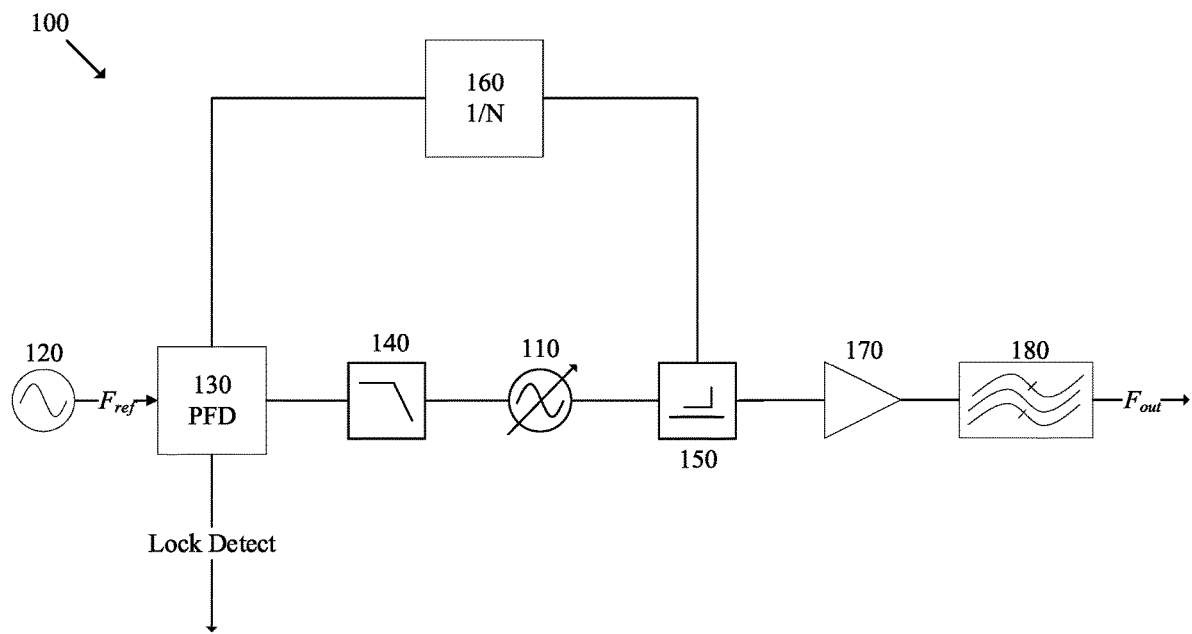
FIG. 1 illustrates an embodiment of a conventional oscillator that maintains a phase lock using a phase locked dielectric resonating oscillator (DRO) configuration wherein the DRO comprises a phase shift element and a mechanical screw.
Figure 1:
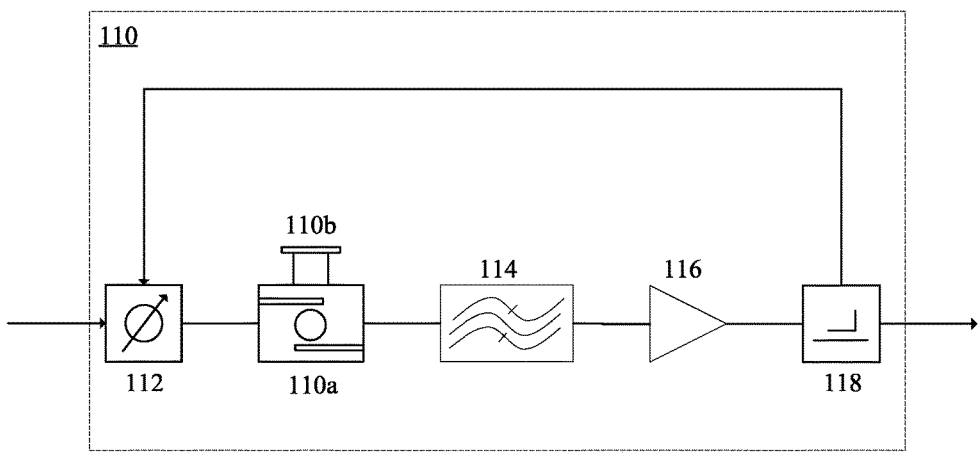

Throughout the drawings, sometimes only one or fewer than all of the instances of an element visible in the view are designated by a lead line and reference character, for the sake only of simplicity and to avoid clutter. It will be understood, however, that in such cases, in accordance with the corresponding description, that all other instances are likewise designated and encompasses by the corresponding description.

DETAILED DESCRIPTION

For the purpose of promoting an understanding of the principles of the disclosure, reference will now be made to the features illustrated in the drawings and specific language will be used to describe the same. It will nevertheless be understood that no limitation of the scope of the disclosure is thereby intended. Any alterations and further modifications, and any further applications of the principles of the disclosure as described herein are contemplated as would normally occur to one skilled in the art to which the disclosure relates. It will be apparent to those skilled in the relevant art that some features that are not relevant to the present disclosure may not be shown in the drawings for the sake of clarity.

At the outset, for ease of reference, certain terms used in this application and their meaning as used in this context are set forth below. To the extent a term used herein is not defined below, it should be given the broadest definition persons in the pertinent art have given that term as reflected in at least one printed publication or issued patent. Further, the present processes are not limited by the usage of the terms shown below, as all equivalents, synonyms, new developments and terms or processes that serve the same or a similar purpose are considered to be within the scope of the present disclosure.

In an aspect, an oscillator is provided having an oscillator input port for receiving a reference signal, an oscillator output port for outputting an oscillator output, an unlocked oscillator configured to oscillate in an unlocked state and output at a resonance frequency configured to drift in response to changes in an operating environment, and a phase locked loop (PLL) including a mixer having an output port configured to output the unlocked oscillator output mixed with a local oscillator output, the mixer output port being in communication with a phase frequency detector and the oscillator output port, and the phase frequency detector being configured to generate a control signal based on a detected phase difference between the reference signal and the mixer output, wherein the control signal adjusts the local oscillator output to compensate for the resonance frequency drift of the unlocked oscillator when mixed with the unlocked oscillator output.

In an embodiment, the phase locked loop further includes a feedback divider coupled between the mixer output port and the phase frequency detector, the feedback divider configured to provide the mixer output, to the phase frequency detector, divided by a divide ratio N.

In an embodiment, the unlocked oscillator comprises a surface acoustic wave (SAW) oscillator. In an embodiment, the unlocked oscillator comprises a dielectric resonator oscillator (DRO).

In an embodiment, the unlocked oscillator comprises an opto-electronic oscillator (OEO).

In an embodiment, the unlocked oscillator comprises a sapphire loaded cavity resonator oscillator.

In an embodiment, the unlocked oscillator comprises a microwave Bragg resonator.

In an embodiment, the local oscillator has a tuning bandwidth selected to span a drift bandwidth of the unlocked oscillator.

In an embodiment, the drift bandwidth of the unlocked oscillator is less than 10 MHz and the tuning bandwidth of the local oscillator is at least 10 MHz.

In an embodiment, the drift bandwidth of the unlocked oscillator is less than 10 MHz and corresponds to the operating environment spanning a temperature range between −40° C. and 85° C.

In an embodiment, the mixer comprises a double balance mixer and the mixer output port is an upper sideband of the double balance mixer.

In an embodiment, the mixer comprises an image reject mixer and the mixer output port provides a sum of the unlocked oscillator output and the local oscillator output.

In an embodiment, the local oscillator comprises a ceramic resonator oscillator.

In an aspect, an oscillator is provided having an oscillator input port for receiving a reference signal, an oscillator output port for outputting an oscillator output, an unlocked oscillator configured to oscillate in an unlocked state and output at a resonance frequency configured to drift in response to changes in an operating environment, and a phase locked loop (PLL) including a local oscillator having a tuning bandwidth, a direct digital synthesizer (DDS) in communication with an output of the local oscillator, the direct digital synthesizer (DDS) configured to divide the local oscillator output by a divide ratio R, a first mixer having an output port configured to output the unlocked oscillator output mixed with an output of the DDS, the first mixer output port being in communication with a phase frequency detector and the oscillator output port, and the phase frequency detector being configured to generate a control signal for adjusting the local oscillator output, the control signal based on a detected phase difference between the reference signal and the first mixer output.

In an embodiment, the PLL further includes an analog-to-digital converter (ADC) configured to receive and digitize the control signal, and a microcontroller in communication with the ADC and the DDS, the microcontroller configured to set the divide ratio of the DDS based on the digitized control signal.

In an embodiment, the divide ratio R is between a first divide ratio R1 and a second divide ratio R2, the first and second divide ratios selected for extending the tuning bandwidth to be greater than a drift bandwidth of the unlocked oscillator.

In an embodiment, the PLL further includes a feedback divider coupled between the first mixer output port and the phase frequency detector, the feedback divider configured to provide the first mixer output, to the phase frequency detector, divided by a divide ratio N.

In an embodiment, the local oscillator comprises a voltage controlled, surface acoustic wave oscillator (VCSO).

In an embodiment, the PLL further includes a second mixer having an output port configured to output the local oscillator output mixed with the DDS output for offsetting the local oscillator output, the second mixer output port being in communication with the first mixer, and the first mixer output port is configured to output the second mixer output mixed with the unlocked oscillator output.

In an aspect, an oscillator is provided having an oscillator input port for receiving a reference signal, a multiplier in communication with the oscillator input port for outputting the reference signal scaled by a factor X, an oscillator output port for outputting an oscillator output, an unlocked oscillator configured to oscillate in an unlocked state and output at a resonance frequency configured to drift in response to changes in an operating environment, and a phase locked loop (PLL) including a local oscillator having a tuning bandwidth, a direct digital synthesizer (DDS) in communication with the multiplier output, the direct digital synthesizer (DDS) configured to divide the multiplier output by a divide ratio R, a first mixer having an output port configured to output an output of the local oscillator mixed with an output of the DDS, for offsetting the local oscillator output by the DDS output, a second mixer having an output port configured to output the first mixer output mixed with the unlocked oscillator output, the second mixer output port being in communication with a phase frequency detector and the oscillator output port, and the phase frequency detector being configured to generate a control signal for adjusting the local oscillator output, the control signal based on a detected phase difference between the reference signal and the first mixer output.

In an embodiment, the PLL further includes an analog-to-digital converter (ADC) configured to receive and digitize the control signal, and a microcontroller in communication with the ADC and the DDS, the microcontroller configured to set the divide ratio of the DDS based on the digitized control signal.

In an embodiment, the divide ratio R is between a first divide ratio R1 and a second divide ratio R2, the first and second divide ratios being selected for extending the tuning bandwidth to be greater than a drift bandwidth of the unlocked oscillator.

In an embodiment, the PLL further includes a feedback divider coupled between the second mixer output port and the phase frequency detector, the feedback divider configured to provide the second mixer output, to the phase frequency detector, divided by a divide ratio N.

In an embodiment, the local oscillator comprises a voltage controlled, surface acoustic wave oscillator (VCSO).

In an aspect, a method for phase locking an oscillator is provided, including: operating an unlocked oscillator in an unlocked state, the unlocked oscillator configured to output at a resonance frequency configured to drift in response to changes in an operating environment, generating a first mixer output from an output port of a first mixer, the first mixer output based on mixing the unlocked oscillator output with a local oscillator output, generating a control signal using a phase frequency detector, the control signal based on a detected phase difference between a reference signal and the first mixer output, and maintaining phase lock with the reference signal based on using the control signal generated by the phase frequency detector to adjust the local oscillator output to compensate for the resonance frequency drift of the unlocked oscillator when mixed with the unlocked oscillator output at the first mixer.

In an embodiment, phase locking the oscillator further includes dividing the first mixer output, by a divide ratio N, using a feedback divider coupled between the phase frequency detector and the mixer.

In an embodiment, phase locking the oscillator further includes dividing the local oscillator output, by a divide ratio R, using a direct digital synthesizer (DDS) coupled between the local oscillator and the first mixer, wherein the first mixer output is based on mixing an output of the DDS with the unlocked oscillator output.

In an embodiment, the divide ratio R is between a first divide ratio R1 and a second divide ratio R2, the first and second divide ratios being selected for extending the tuning bandwidth to be greater than a drift bandwidth of the unlocked oscillator.

In an embodiment, phase locking the oscillator further includes offsetting the local oscillator output using a second mixer, the second mixer having an output port configured to output the local oscillator output mixed with the DDS output, wherein the first mixer output is based on mixing the second mixer output with the unlocked oscillator output.

In an embodiment, phase locking the oscillator further includes scaling the reference signal by a factor X using a multiplier, wherein the DDS output is based on the scaled reference signal.

In an aspect, the disclosure provides a non-transitory computer-readable medium having instructions stored thereon that, when executed by a computing device, cause the computing device to perform a method for phase locking an oscillator comprising an unlocked oscillator operating in an unlocked state.

In an aspect, the disclosure herein provides an oscillator, comprising: an oscillator input port for receiving a reference signal; a phase lock loop including a resonating oscillator comprising a resonator having a resonance frequency drifting in response to an environmental stimulus, the phase lock loop maintaining the resonating oscillator in a phase lock with the reference signal; a drift compensation circuit for generating a drift compensation signal comprising a drift offset based on an indicator of a drift in the resonance frequency of the resonator; a mixer in communication with the resonating oscillator and the drift compensation circuit and configured to provide a mixer output comprising a resonating oscillator output offset based on the drift compensation signal; a phase frequency detector in communication with the mixer and the oscillator input port and configured to detect a phase difference between the reference signal and the mixer output for generating a control signal for tuning the resonating oscillator, and an oscillator output port for outputting an oscillator output comprising the mixer output.

In an embodiment, the drift compensation circuit generates a sideband offset, wherein the drift compensation signal further comprises the sideband offset for increasing a frequency separation between the resonating oscillator output and the mixer output.

In an embodiment, the drift compensation circuit comprises a mixer for generating the drift compensation signal based on mixing the drift offset and the sideband offset.

In an embodiment, the drift compensation circuit is in communication with the oscillator input port for generating the sideband offset based on scaling a reference frequency of the reference signal.

In an embodiment, the drift compensation circuit comprises a multiplier for generating the scaled reference frequency based on a scale factor of the multiplier.

In an embodiment, the drift compensation circuit further comprises a direct digital synthesizer (DDS) for generating the drift offset, the DDS having a clock set based on the scaled reference frequency, and a microcontroller for adjusting an output of the DDS based on the indicator of the drift in the resonance frequency.

In an embodiment, the indicator of the drift in resonance frequency comprises the control signal for tuning the resonating oscillator, the drift compensation circuit further comprising a first analog-to-digital converter for quantizing the control signal for input to the microcontroller.

In an embodiment, the indicator of the drift in the resonance frequency comprises a power output of the resonating oscillator, the drift compensation circuit further comprising a power detector for detecting the power output of the resonating oscillator, and a second analog-to-digital converter for quantizing the detected power output for input to the microcontroller.

In an embodiment, the indicator of the drift in the resonance frequency comprises a resonator temperature, wherein the drift compensation circuit further comprises a temperature sensor for determining the resonator temperature.

In an embodiment, the microcontroller is configured to include a lookup-table for relating the resonator temperature to the drift in the resonance frequency.

In an embodiment, the drift offset is substantially the same as the drift in the resonance frequency.

In an embodiment, the resonating oscillator comprises a voltage-controlled dielectric resonating oscillator.

In an embodiment, the resonator comprises a high Q factor.

In an embodiment, the resonator comprises a Q factor of at least 50,000.

In an embodiment, the resonator comprises a sapphire loaded cavity whispering gallery mode resonator.

In an embodiment, the phase lock loop further comprises a bandpass filter at an output of the mixer, for filtering the mixer output.

In an embodiment, the phase lock loop further comprises a feedback divider having a divide ratio N, the feedback divider in communication with an input to the phase frequency divider for scaling down the mixer output to a scale of the reference signal based on the divide ratio N.

In an aspect, the disclosure herein provides a method for compensating for resonance drift in an oscillator having a phase locked resonating oscillator, comprising maintaining a resonating oscillator in a phase lock with an external reference, the resonating oscillator comprising a resonator having a resonance frequency drifting in response to an environmental stimulus; generating a drift compensation signal comprising a drift offset based on an indicator of a drift in the resonance frequency; generating a mixer output for offsetting the drift in the resonance frequency based on mixing a resonating oscillator output with the drift compensation signal; detecting a phase difference between the mixer output and the external reference, and tuning operation of the resonating oscillator based on the detected phase difference to maintain operation of the resonating oscillator at the resonance frequency.

In an embodiment, the method for compensating for resonance drift further comprises generating a sideband offset for increasing a frequency separation between the mixer output and the resonating oscillator output, wherein the drift compensation signal further comprises the sideband offset.

In an embodiment, generating the drift compensation signal comprises mixing the drift offset and the sideband offset.

In an embodiment, generating the sideband offset comprises scaling a reference frequency of the external reference.

In an embodiment, scaling the reference frequency of the external reference comprises multiplying the reference frequency by a scale factor.

In an embodiment, generating the drift offset comprises use of a direct digital synthesizer (DDS), wherein the DDS is configured to receive a clock signal comprising the sideband offset, and to receive the indicator of the drift in the resonance frequency for adjusting an output of the DDS to provide the drift offset.

In an embodiment, the method for compensating for resonance drift further comprises detecting a control signal for tuning operation of the resonating oscillator based on the detected phase difference, wherein the indicator of the drift in the resonance frequency comprises the control signal.

In an embodiment, the method for compensating for resonance drift further comprises detecting a power output of the resonating oscillator wherein the indicator of the drift in the resonance frequency comprises the power output.

In an embodiment, the method for compensating for resonance drift further comprises detecting a resonator temperature of the resonator wherein the indicator of the drift in resonance frequency comprises the resonator temperature.

In an embodiment, determining the drift in the resonance frequency is based on a pre-calibrated look-up table of resonator temperatures and corresponding resonance frequencies.

In an embodiment, the drift offset is substantially the same as the drift in the resonance frequency.

In an embodiment, the resonating oscillator comprises a voltage-controlled dielectric resonating oscillator.

In an embodiment, the resonator comprises a high Q factor.

In an embodiment, the resonator comprises a Q factor of at least 50,000.

In an embodiment, the resonator comprises a sapphire loaded cavity whispering gallery mode resonator.

In an embodiment, the method for compensating for resonance drift further comprises filtering the mixer output based on a passband of a bandpass filter.

In an embodiment, the method for compensating for resonance drift further comprises scaling the mixer output base on a divide ratio N, for scaling the mixer output to a scale of the external reference.

In aspect, the disclosure herein provides a non-transitory computer readable medium having instructions stored thereon that, when executed by a computing device, cause the computing device to perform a method for compensating for resonance drift in an oscillator having a phase locked resonating oscillator.

In an aspect, an oscillator as disclosed herein may be configured to maintain a phase lock between a reference signal and an output of a mixer. The mixer receives as inputs, an unlocked oscillator output for mixing with a low frequency oscillator output. The unlocked oscillator is configured to operate in an unlocked state and output at a resonance frequency that drifts in response to changes in an operating environment, as may occur in response to changes in temperature, mechanical perturbations, or other environmental stimulus. Loop feedback resulting from the phase lock provides a control signal for adjusting the low frequency oscillator which in turn provides a low frequency oscillator output that can compensate for the resonance frequency drift when mixed with the unlocked oscillator output. The low frequency thermal and mechanical phase noise of the unlocked oscillator and the low frequency oscillator, within the loop bandwidth, thus match and effectively cancel one another out when mixed at the mixer, allowing the oscillator to maintain a phase lock as the unlocked oscillator drifts in response to changes in the operating environment. In this manner, the local oscillator suppresses phase and frequency variations from the unlocked oscillator that fall within the loop bandwidth leading to a constant output frequency from the mixer to the loop feedback divider, it is this signal that then acts as the source output. Outside the control loop bandwidth the oscillator phase noise includes the combination of the free running oscillator phase noise and the low frequency oscillator phase noise. Embodiments as disclosed herein include selecting the low frequency oscillator phase noise to be the same or lower than the free running oscillator phase noise for frequency offsets that exceed the control loop bandwidth so as not to degrade the performance of the free running oscillator outside the control loop bandwidth.

In an aspect, an oscillator as disclosed herein may include a phase lock loop comprising a phase locked resonator having a resonance frequency drifting in response to changes in an operating environment, as may occur in response to changes in temperature, mechanical perturbations, or other environmental stimulus. The oscillator further includes a drift compensation circuit configured to monitor indicators of environmental stimulus for use in generating a drift offset for compensating resonator drift resulting from the environmental stimulus. Loop feedback based in part on the drift offset provides a control signal for adjusting operation of the resonator to compensate for drift and thereby maintain operation at the resonance frequency, minimizing phase noise and insertion loss in the resonator.

An oscillator as disclosed herein operates in stark contrast to the conventional configuration illustrated in FIG. 1 and described further below. For example, conventional configurations incorporate a phase locked oscillator, such as a dielectric resonator oscillator (DRO) comprising a mechanical screw for setting a center frequency of the DRO and a phase shift element that counteracts drift to maintain the DRO in a locked state. Other conventional configurations may include a fixed offset frequency. Regardless, such conventional configurations are limited in maintaining a phase lock or fixed offset frequency when subjected to changes in their operating environment. For example, temperature changes or mechanical perturbations require a phase shift element to compensate for drift in the dielectric resonator in order to maintain a phase lock, thereby causing the phase locked DRO to operate offset from its resonance frequency, resulting in increased phase noise. Conversely, an oscillator as disclosed herein may include an unlocked oscillator that is rather intended to operate in an unlocked state and drift in response to changes in the operating environment, thereby maintaining oscillation at the resonant frequency which drifts in response to changes in the operating environment. Other implementations in accordance with the present disclosure are further disclosed herein.

An oscillator as disclosed herein thus includes several advantages over conventional configurations. For example, an unlocked oscillator does not require either a mechanical tuning screw or a phase shift element since it operates in an unlocked state intended to drift rather than maintain a phase lock. The unlocked oscillator thus simplifies design considerations, improves phase noise by removing the additional control lines required to supply a control voltage to the phase shift element, and removes the inherent limitations introduced by a mechanical screw. Furthermore, an unlocked oscillator such as a DRO will provide optimal performance as it can be designed to operate at its corresponding resonance frequency, which provides the maximum Q factor, which further corresponds to the lowest phase noise and lowest insertion loss. Of further advantage is that the dielectric resonator no longer needs to match the thermal expansion properties of the cavity in which it is located, which is a requirement of the conventional phase locked DRO often resulting in exotic cavity material such as invar and in some cases electronic thermal control such as use of oven control to stabilize temperature. DRO are known for microphonic vibration sensitivity the present invention uses the phase locked loop to suppress the vibration induced noise from the DRO without requiring the DRO to be mechanically isolated from its environment, providing a significant advantage over conventional phase locked DROs which must be de-coupled from the environmental mechanical vibration.

Embodiments Having an Unlocked Oscillator for Tracking a Drift in Resonance Frequency FIG. 1 illustrates a topology for a known conventional oscillator 100 configured using a phased locked dielectric resonator oscillator (DRO) 110. The conventional oscillator 100 implements a phase locked loop comprising the DRO 110, a phase frequency detector (PFD) 130, a low pass filter 140, a coupler 150, and a feedback divider 160. The oscillator 100 further includes an output path comprising an amplifier 170 and a bandpass filter 180.

The phase lock loop is designed to maintain the DRO 110 in a phase lock with an external reference oscillator 120. The DRO 110 includes a mechanical tuning screw 110*b* for tuning a dielectric resonator 110*a* for setting the center frequency of the DRO 110. However, the mechanical tuning screw 110*b* introduces manufacturing complexity, especially with respect to achieving a hermetic seal as may be required to environmentally harden the oscillator 100. For example, once the oscillator 100 is hermetically sealed, one cannot access the mechanical screw 110*b* and adjust the center frequency without first breaking the hermetic seal. The resonator 110*a* also introduces increasing mechanical design tolerance to meet specific target frequencies as the quality factor of the resonator 110*a* increases. Furthermore, the resonator 110*a* must be replaced with an alternate resonator if operating beyond the mechanical tuning range of the resonant frequency.

The DRO 110 further includes a phase shift element 112, bandpass filter 114, amplifier 116, and coupler 118. The phase shift element 112 adjusts an operating phase of the DRO 110 so as to maintain a fixed frequency and phase relationship between the DRO 110 and the reference oscillator 120. However, the dielectric resonator 110*b* will respond to changes in the operating environment by drifting in frequency away from the center frequency fixed by the mechanical tuning screw 110*b*. For example, temperature changes or mechanical perturbations will cause the dielectric resonator 110*b* to drift from the center frequency, thus the phase lock will cause the DRO 110 to oscillate offset from its resonance characteristics, resulting in an increase in insertion loss and an increase in phase noise. As the mechanical screw 110*b* is inherently limited in adjusting the center frequency of the DRO 110, the oscillator 100 is limited in its operational capabilities when subject to changes in its operating environment. Such mechanical tuning screws also add complexity in the manufacturing process through the requirement for a manual alignment phase. Design reliability is also impacted by the use of such screws as very small changes in the screw depth can have significant impact on the operational frequency of the oscillator. Presence of a tuning screw in the metal cavity also impacts the resonator quality factor, increasing the phase noise of the oscillator. Accordingly, operating a conventional oscillator 100 over a wide temperature range requires significant engineering effort. For example, achieving thermal compensation to limit the frequency drift to a range for which the loop gain is sufficient for maintaining suitable levels of phase noise may require matching the thermal expansion coefficient of the cavity and the temperature coefficient of the dielectric resonator 110a. As such, conventional oscillators are limited in their ability to operate over a wide temperature range while also maintaining low phase noise. Furthermore, if there is a sufficiently large temperature change then the insertion loss of the resonator can exceed the feedback gain of the oscillator and the oscillations will stop.

Figure 2:
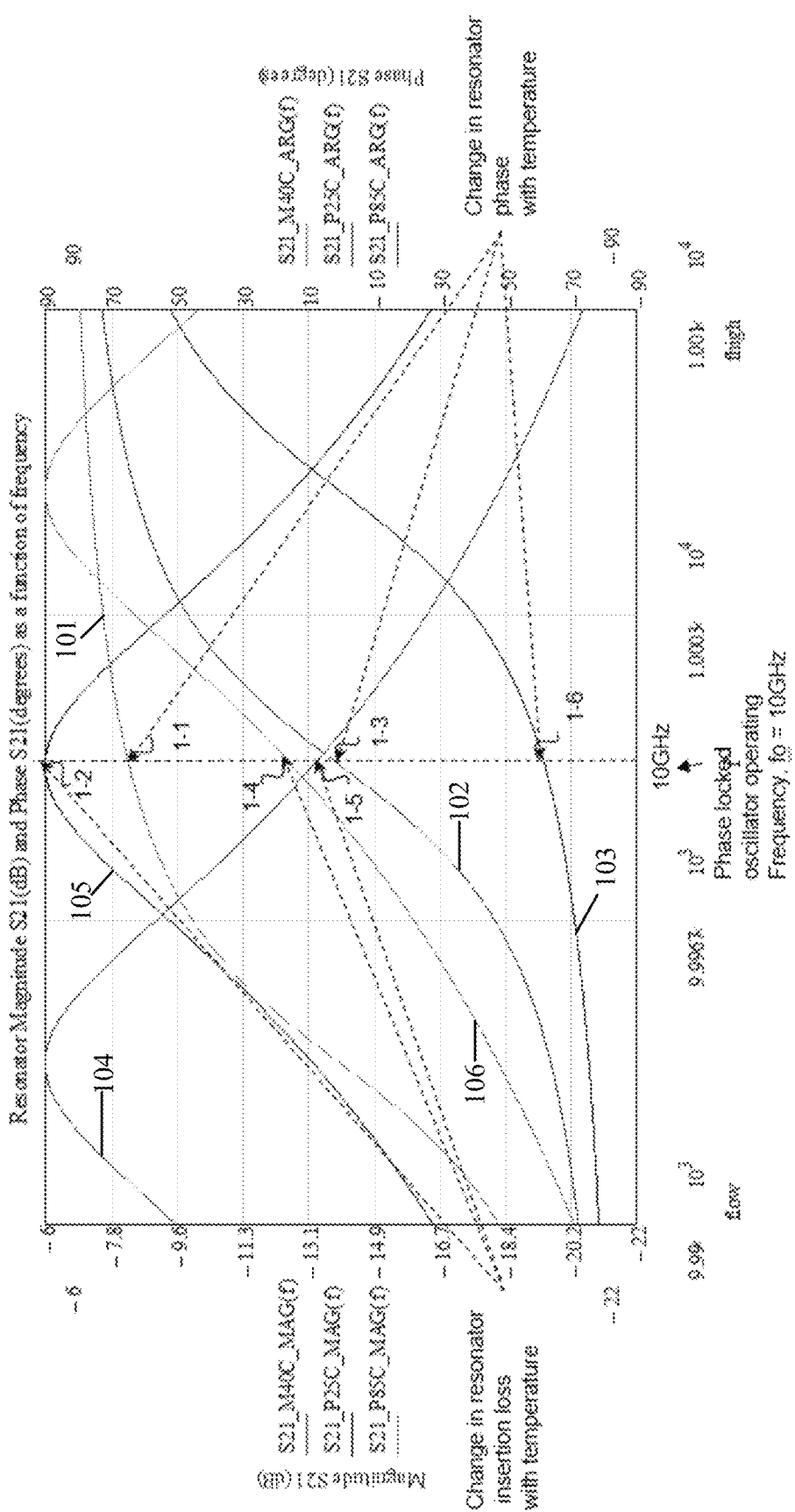
FIG. 2 is a graph illustrating several plots of resonator magnitude and phase as a function of frequency for a variety of temperatures.

FIG. 2 illustrates several plots of resonator magnitude and phase as a function of frequency for a variety of temperatures. Plots 101, 102, and 103 illustrate resonator phase as a function of frequency for −40° C., +25° C., +85° C., respectively. Plots 104, 105 and 106, illustrate the resonator magnitude as a function of frequency for temperatures −40° C., +25° C., and +85° C., respectively. Each point 1-1, 1-3, and 1-6 represent the resonator phase at 10 GHz. Each of points 1-2, 1-4, and 1-6 represent the resonator insertion loss at 10 GHZ. Point 1-2 represents the lowest insertion loss of the resonator, as the operating temperature is increased or decreased the insertion loss increases to that of points 1-4 or 1-6.

The rate of change in insertion phase of the resonator with frequency increases with resonator quality factor. In order to minimize the oscillator phase noise a high quality factor is required. Consequently, in the case of high quality factor low phase noise oscillators there is a trade-off between the phase noise and operating temperature range. Some forms of narrow band oscillators, such as DROs, require precise frequency centering of the resonator using a mechanical tuning screw, to ensure that the oscillation condition is met over the operating temperature range. Even in the case of oscillators that employ such mechanical frequency setting the phase noise of the oscillator is degraded at the upper and lower operating temperatures because the rate of change of phase as a function of frequency offset from resonance decreases with increasing offset from the oscillator resonance frequency. Decreasing the resonator rate of change of phase increases the instantaneous frequency excursions in the oscillator loop required to compensate for random phase fluctuations in the loop components, which in turn leads to higher output phase noise levels from the oscillator.

FIG. 2 shows the change in resonator phase gradient, point 1-3 is the point of maximum phase gradient and consequently the lowest phase noise which occurs when the oscillation frequency and resonator resonance frequency are equal. As the oscillator temperature increases or decreases the phase gradient decreases as shown by points 1-1 and 1-6, the reduction in phase gradient results in an increase in the oscillator phase noise and subsequent degradation in system performance.

Figure 3:
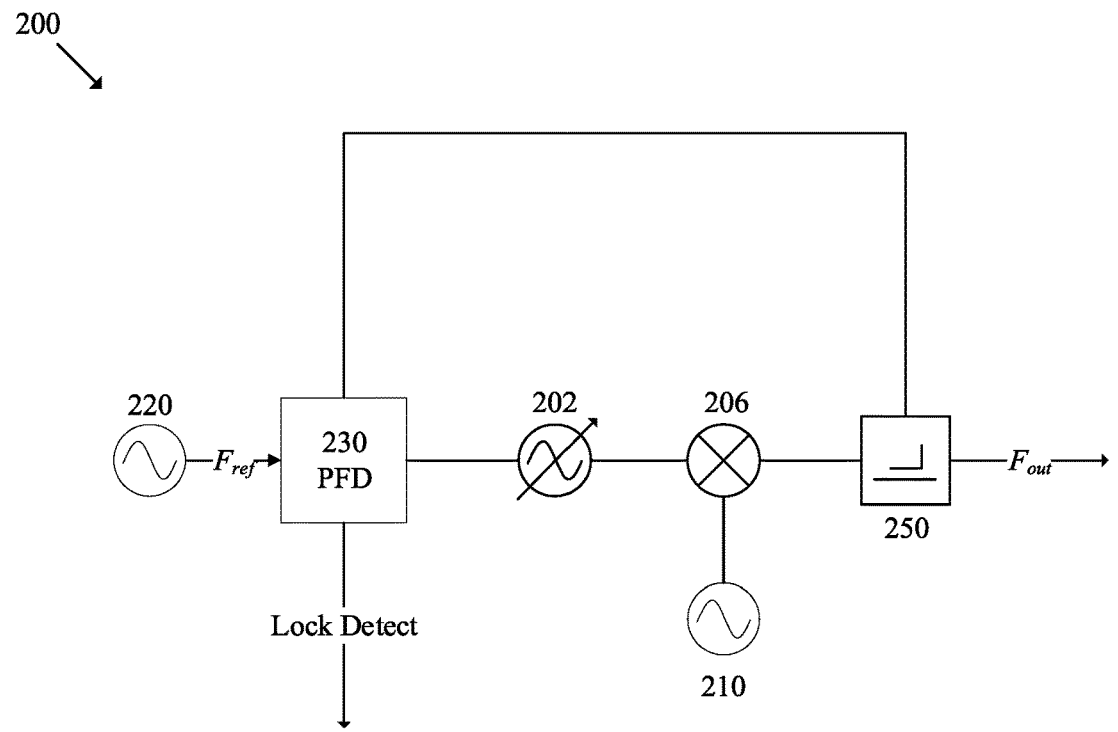
FIG. 3 illustrates an embodiment of an oscillator in accordance with the present disclosure that maintains a phase lock using an unlocked oscillator configured to operate in an unlocked state and output at a resonance frequency configured to drift in response to changes in the operating environment.
Figure 3:
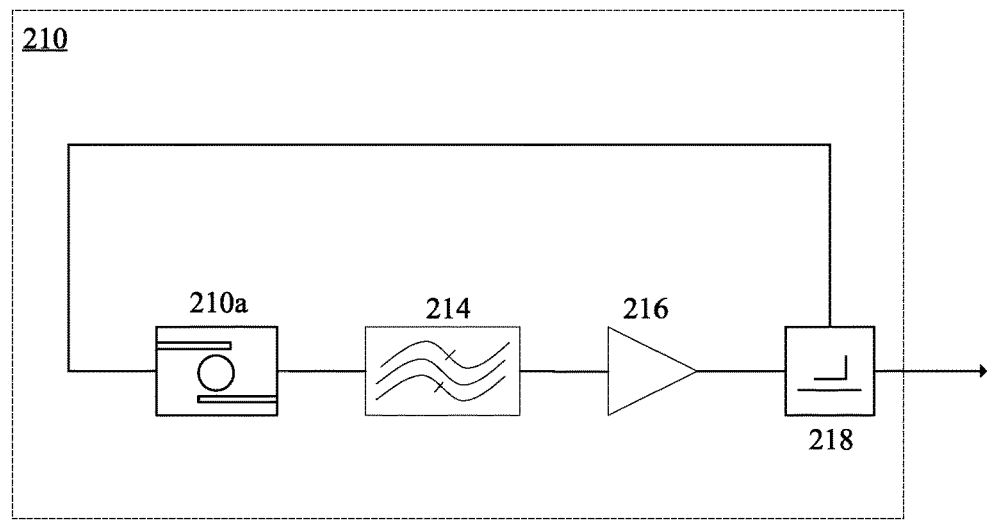

FIG. 3 illustrates an example implementation of an oscillator 200 as disclosed herein. The oscillator 200 includes a phase lock loop comprising a phase frequency detector 230, a low frequency local oscillator 202, a mixer 206, and a coupler 250. The oscillator 200 is configured to maintain a phase lock between an output of the mixer 206 and a reference signal $F_{ref}$ and further provide an output $F_{out}$ based on the output of the mixer 206. The reference signal $F_{ref}$ may be provided by an external crystal reference oscillator 220 or other source, as may be coupled to an input port of the oscillator 200. A typical reference signal $F_{ref}$ may have a frequency anywhere from 10 MHz to 1 GHz however, those skilled in the art will appreciate that the reference signal is based on desired parameters for the application or task at hand.

The oscillator 200 is implemented using an unlocked oscillator 210, which is depicted as a dielectric resonator oscillator 210 comprising a dielectric resonator 210a, bandpass filter 214, amplifier 216, and coupler 218. The unlocked oscillator 210 however need not be a DRO, as other oscillators, such as a surface acoustic wave (SAW) oscillator or optoelectronic oscillator (OEO), may instead be used. Notably, the unlocked oscillator 210 does not require a mechanical screw or phase shift element as the unlocked oscillator 210 is rather intended to operate in an unlocked state and drift in response to changes in an operating environment. For example, the resonance characteristic of the dielectric resonator 210a is intended to drift in response to temperature changes or mechanical perturbations without requiring the dielectric resonator oscillator 210 to maintain a phase lock. Consequently, a phase or frequency of an output of the unlocked oscillator 210 will drift in response to temperature changes, mechanical perturbations, and other stimulus which excites the resonance characteristic of the unlocked oscillator 210. Furthermore, as the oscillator 200 does not require thermal stabilization, other design considerations may be relaxed. For example, the oscillator 210 does not require invar resonator cavities and aluminum housing may be used for the resonator cavity.

Advantageously, operating the unlocked oscillator 210 in an unlocked state will cause the unlocked oscillator 210 to oscillate at the highest Q factor oscillation frequency corresponding to the resonance characteristics of the oscillator 210. This prevents the loop insertion loss from rising which in turn reduces amplifier power dissipation. Furthermore, gain requirements around the oscillator loop are reduced which can enable the use of lower gain loop amplifiers, such as SiGe amplifiers, which would further improve phase noise performance through provision of lower flicker noise corner frequencies. Components in the oscillator 210 may however introduce a static phase shift and cause the unlocked oscillator 210 to oscillate offset from the resonance frequency. In an example implementation, the oscillator 210 includes a passive delay element to compensate for the static phase shift.

The output of the phase frequency detector 230 acts as a control for adjusting the low frequency oscillator 202, which functions to suppress phase noise within a loop bandwidth of the oscillator 200, and otherwise compensate for the resonance frequency drift of the unlocked oscillator 210. However, the low frequency oscillator 202 will add phase noise that falls outside of the loop bandwidth, to the phase noise of the oscillator 210. Accordingly, selecting a low frequency oscillator 202 having a narrow bandwidth that mirrors the maximum drift exhibited by the unlocked oscillator 210 will help to minimize the phase noise contribution of the low frequency oscillator 202 to the circuit overall output phase noise. For example, if the unlocked oscillator 210 has a frequency drift bandwidth of 10 MHz or less for an operating environment subject to a 125° C. temperature range (e.g. −40° C. to +85° C.), then selecting a local oscillator 202 having a 10 MHz tuning bandwidth to compensate for up to 10 MHz of drift is suitable; the narrower the bandwidth of the low frequency oscillator 202, the lower the additive phase noise of the part. The low frequency oscillator 202 can otherwise be selected for operation over a wide range of operating frequencies whilst the unlocked oscillator 210 can remain fixed to avoid having to redesign and remanufacture different resonator frequencies. In an example implementation, the low frequency oscillator 202 is a voltage controlled oscillator. In another example implementation, the low frequency oscillator 202 is a ceramic resonator oscillator. In another example implementation, the low frequency oscillator 202 is a narrowband oscillator.

Figure 4:
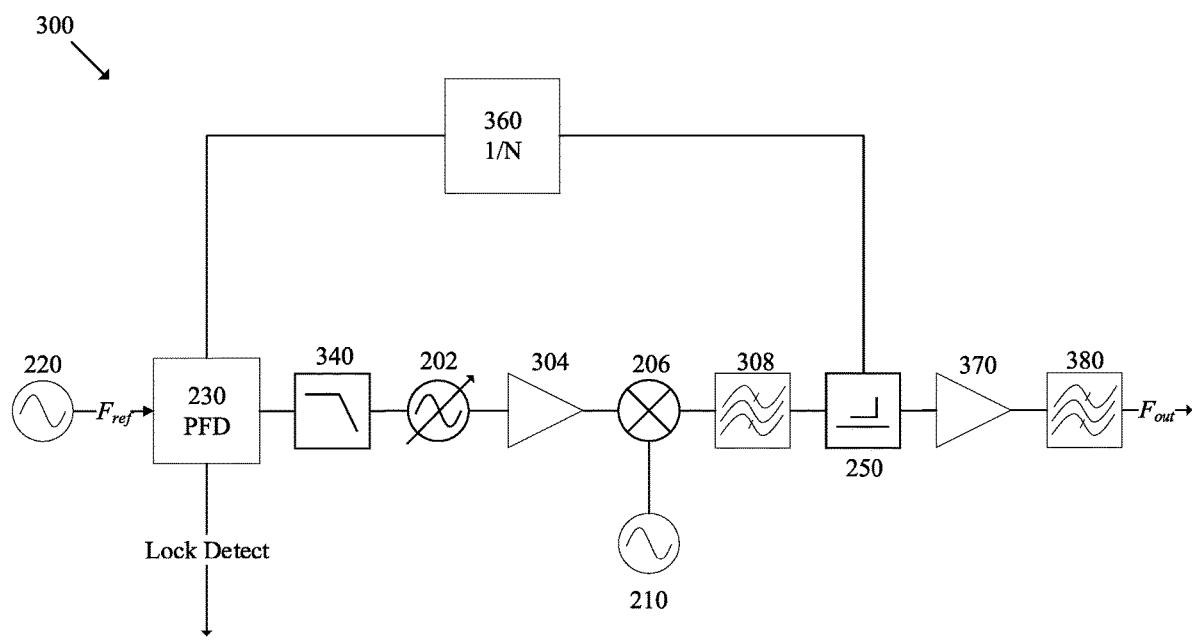
FIG. 4 illustrates an embodiment of an oscillator according to FIG. 3 further comprising a feedback divider in the phase lock loop.

The mixer 206 generates an output based on mixing the output of the low frequency local oscillator 202 with the output of the unlocked oscillator 210. The local oscillator 202 provides an output configured to mix with an output of the local oscillator 210 and compensate for the resonance frequency drift. Consequently, mixing the two signals eliminates phase noise present within either signal that is within a loop bandwidth of the oscillator 200. Furthermore, the mixer output scales to the frequency of the unlocked oscillator 210, and the oscillator 200 may thus require a feedback divider as illustrated in FIG. 4, to step the mixer output down by a divide ratio for comparison with the reference signal $F_{ref}$. In an example implementation, the mixer 206 is a double balance mixer and the mixer output is an upper sideband output of the mixer 206. In another example implementation, the mixer 206 is an image reject mixer and the output is the product of the mixed signals.

FIG. 4 illustrates an oscillator 300 which replicates the oscillator 200 of FIG. 3, and further comprises components typically used in phase locked loops including a low pass filter 340, amplifiers 304 and 370 to provide gain for losses within the loop, bandpass filters 308 and 380, and feedback divider 360.

Figure 5A:
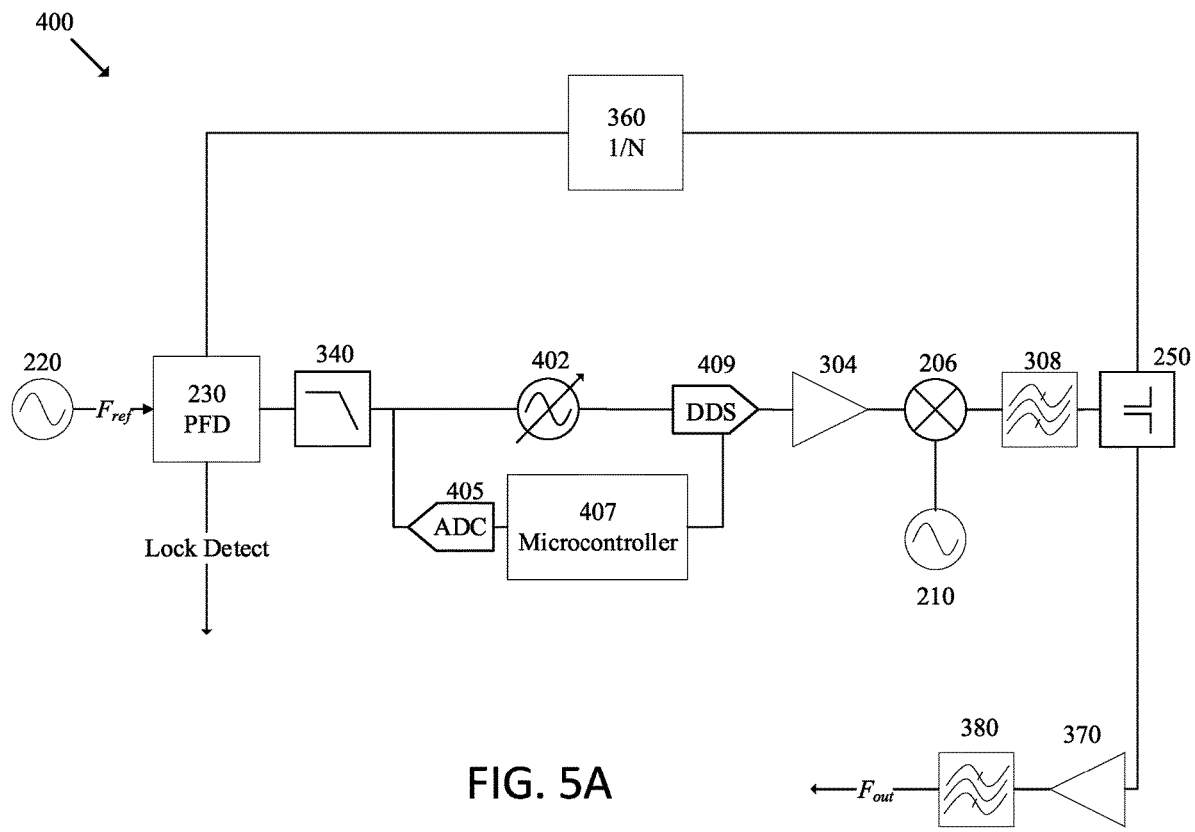
FIG. 5A illustrates an embodiment of an oscillator according to FIG. 4 further comprising a direct digital synthesizer for extending a tuning bandwidth of a voltage controlled surface acoustic wave oscillator.
Figure 5B:
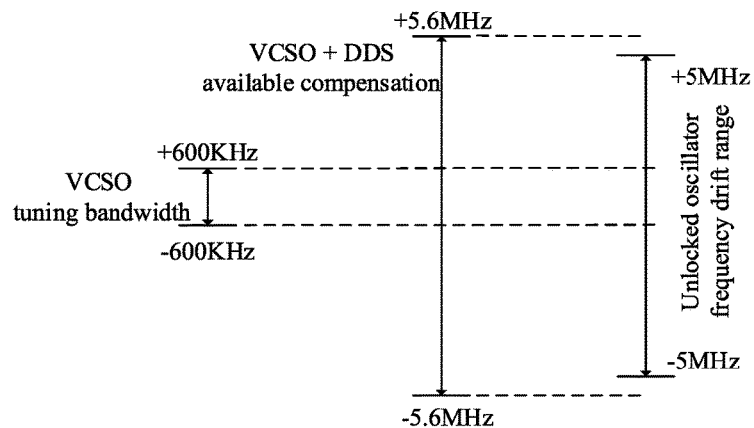
FIG. 5B is a plot based on FIG. 5A illustrating a tuning bandwidth of each of: the voltage controlled surface acoustic wave oscillator (VCSO), the extended tuning bandwidth, and the unlocked oscillator frequency drift range.

FIG. 5A illustrates an oscillator 400 which replicates the oscillator 300 of FIG. 4, and further comprises an analog-to-digital converter (ADC) 450, microcontroller 407, and direct digital synthesizer (DDS) 409 which function as a tuning bandwidth module for extending a tuning bandwidth of the oscillator 402 whilst maintaining low phase noise. In particular, the oscillator 402 implements a low phase noise, voltage controlled surface acoustic wave oscillator (VCSO) 402 having a tuning bandwidth which compensates for only a portion of the frequency drift range of the unlocked oscillator 210. The output of the VCSO 402 acts as the input clock for the DDS 409 while the ADC 405 and the microcontroller 407 can set and control a divide ratio for the DDS 409. The DDS 409 functions to extend the tuning bandwidth and compensate for the whole frequency drift range exhibited by the unlocked oscillator 210. In this manner, the oscillator 400 can implement a lower phase noise VCSO 402 because of the relaxed requirements for tuning bandwidth, thereby improving the phase noise performance of the oscillator 400. Advantageously the tuning bandwidth module can provide sub Hz frequency tuning resolution. As an illustrative example, the unlocked oscillator 210 may be expected to exhibit a frequency drift of up to 10 MHz over a temperature range experienced in its operating environment, and the VCSO 402 can be selected to provide a tuning bandwidth for compensating a portion of that drift, for example +/−600 kHz. As the VCSO tuning voltage approaches its maximum value, the DDS division ratio is adjusted to maintain the VCSO lock over the 10 MHz drift. For a VCSO 402 having a 1 GHz clock, the DDS can divide the 1 GHz clock by 10 to achieve 100 MHz and further adjust the divide ratio to 9.09 to achieve 110 MHz, resulting in a 10 MHz extension of the tuning bandwidth. FIG. 5B. is a graph that further illustrates the foregoing example of extending a +/−600 kHz tuning bandwidth using a tuning bandwidth module to compensate for a 10 MHz drift exhibited by an unlocked oscillator. It is noted that the DDS will reduce the required instantaneous tuning bandwidth of the VCSO by a factor of 10 to +/−60 KHz. A DDS adjustment range may also correct an offset of a center frequency of the oscillator 210 arising from resonator dimensional manufacturing tolerance.

Figure 6A:
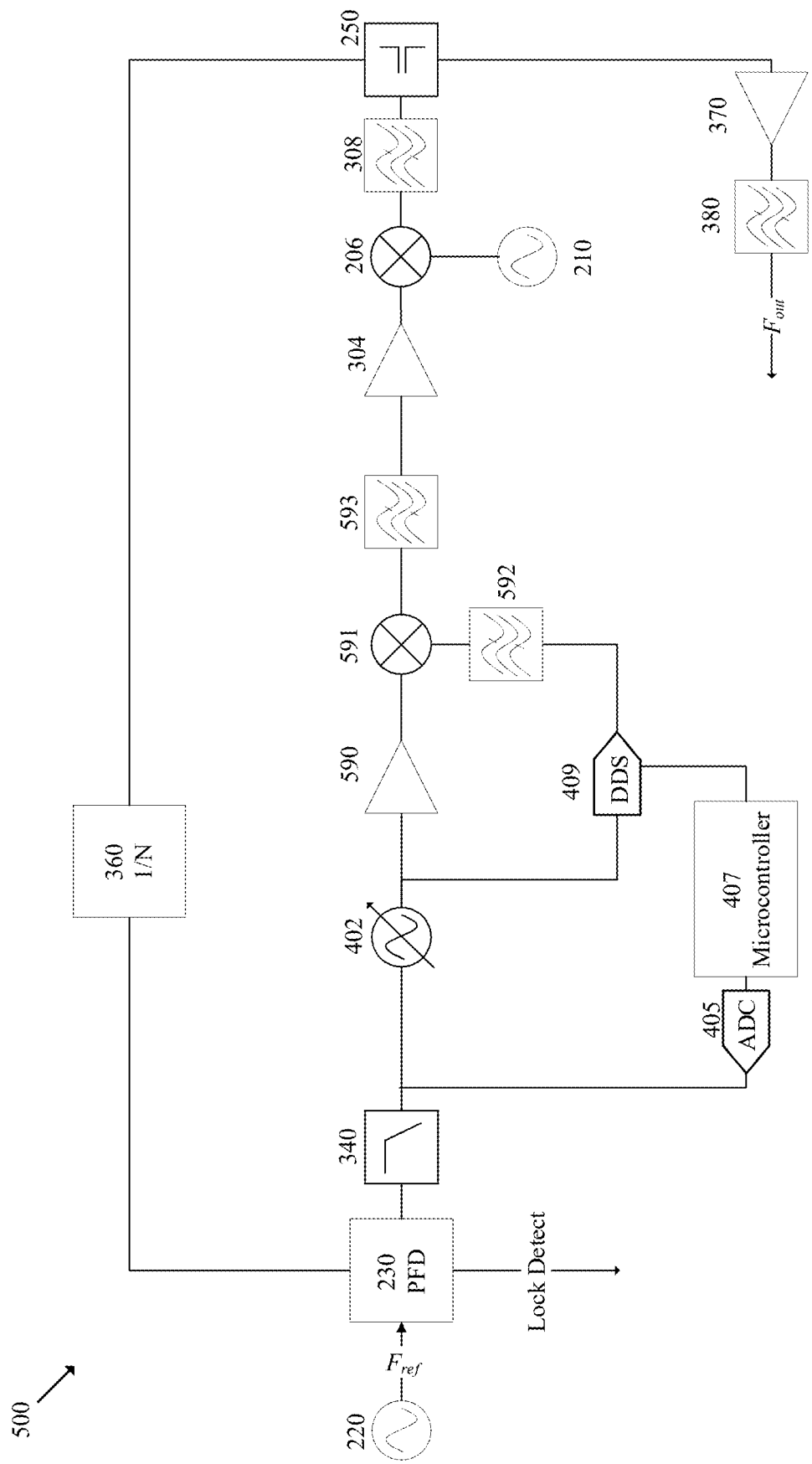
FIG. 6A illustrates an embodiment of an oscillator according to FIG. 5A further comprising a mixer for use in offsetting the VCSO.
Figure 6B:
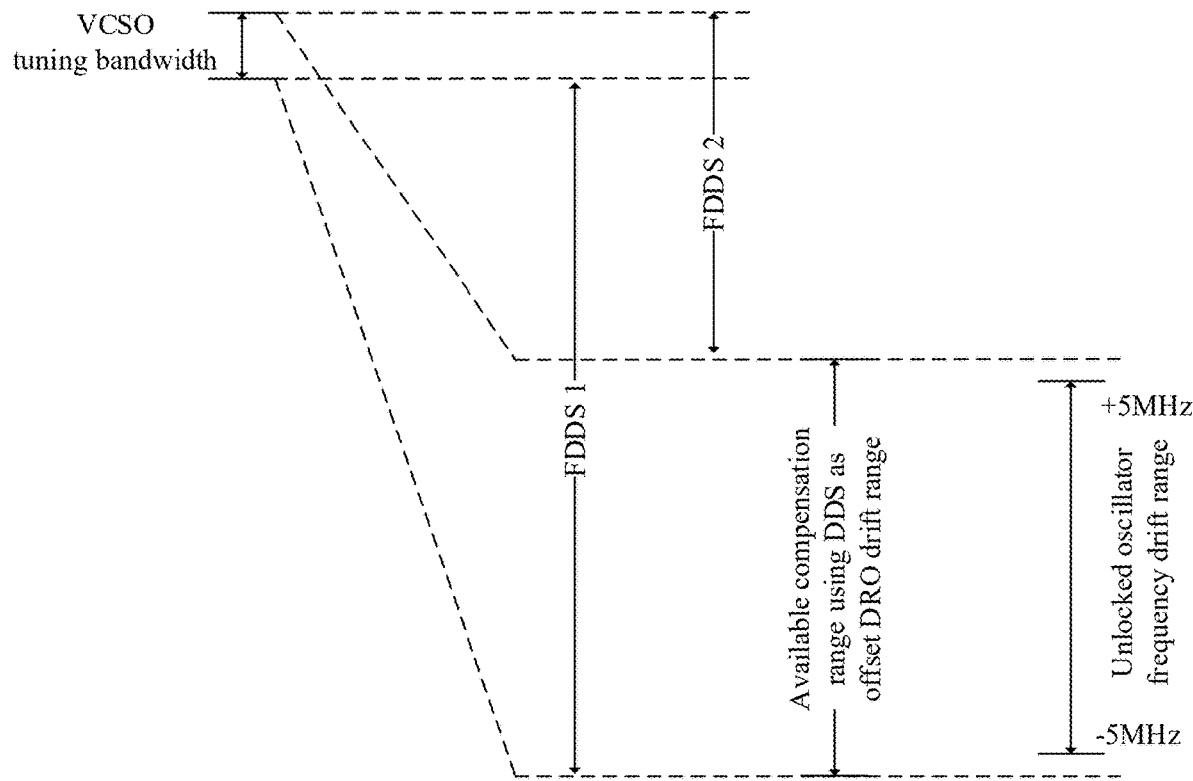
FIG. 6B is a plot based on FIG. 6A illustrating a tuning bandwidth of the VCSO offset and compensated using the DDS to compensate for frequency drift.

FIG. 6A illustrates an oscillator 500 which replicates the oscillator 400 of FIG. 5A and further comprises an amplifier 590, mixer 591, and bandpass filters 592 and 593. The DDS 409 is applied as a frequency offset through the mixer 591. In this manner, there is no reduction in instantaneous bandwidth of the VCSO. FIG. 6B illustrates the increase in operational bandwidth of the VCSO through use of the DDS offset signal. In an example implementation, the mixer 591 is an image rejection mixer, increasing suppression of unwanted sideband and enabling increased operational bandwidth of the DDS 409 through use of upper or lower sidebands. In an example implementation, $F_{ref}$ is 100 MHz, the VCSO outputs at 1 GHz, and the unlocked oscillator 210 drifts between 10.1 GHz and 10.11 GHz. In this implementation, the DDS 409 functions to offset the VCSO 402. For example, the DDS 409 can achieve outputs of 100 MHz and 110 MHz respectively using divide ratios of 10 and 9.09, as demonstrated above with reference to FIG. 6A. Through mixing, the offset mixer 591 offsets the 1 GHz output of the VCSO 402 by the output of the DDS 409. Thus an upper sideband output of the offset mixer 591 can output at 1100 MHz to 1110 MHz, which the bandpass filter 593 can then select. In this manner, a tuning bandwidth of the VCSO 402 can be both extended and offset. In an embodiment, the feedback divider 360 receives an upper sideband output of the mixer 206; and the system output $F_{out}$ is a lower sideband output of the mixer 206. For example, the oscillator disclosed herein can maintain a phase lock based on comparing an input reference with an upper sideband output of a mixer that has been stepped down using a feedback divider; and, can concurrently provide a system output based on a lower sideband output of the same mixer.

Figure 7:
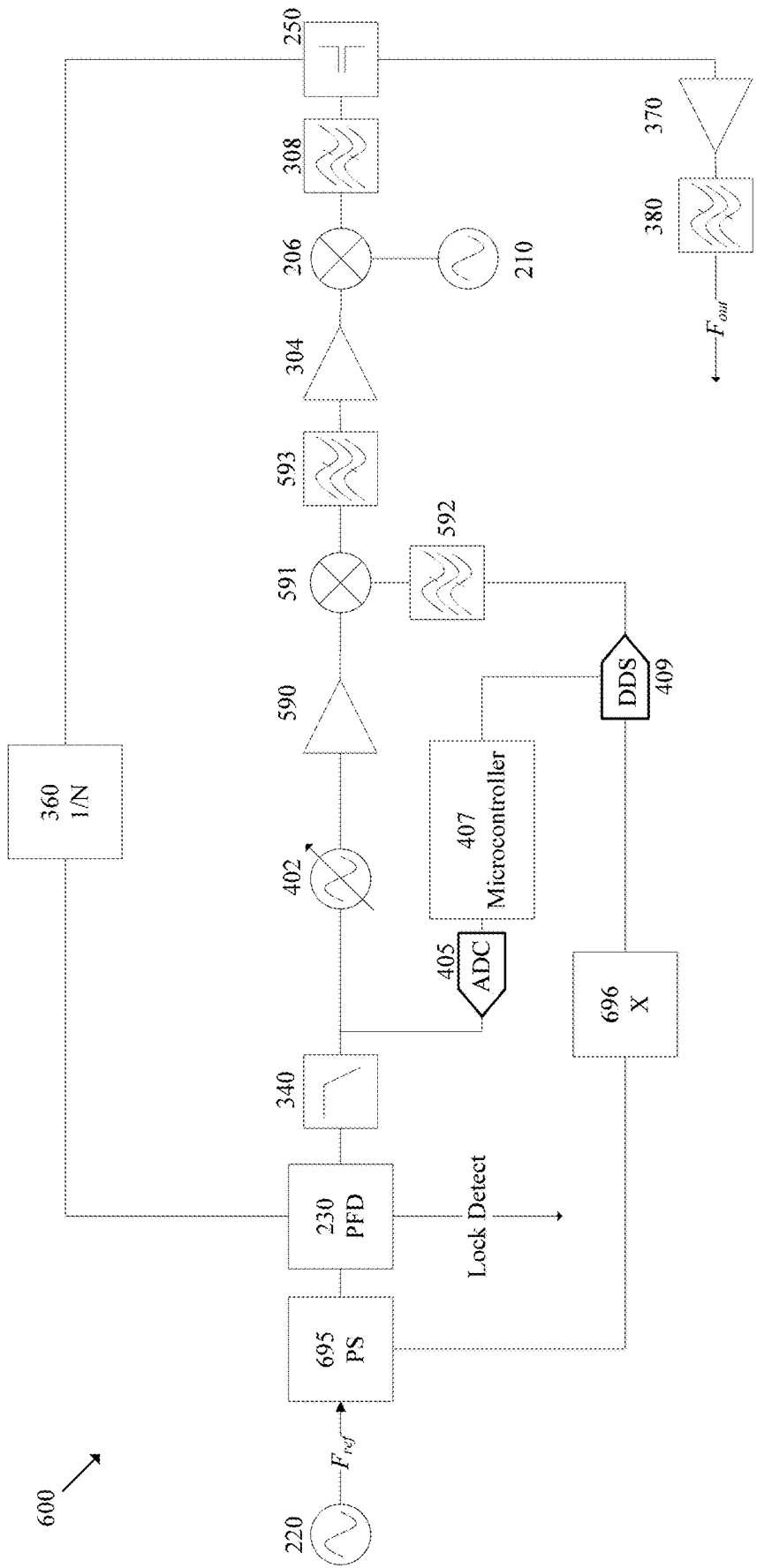
FIG. 7 illustrates an embodiment of an oscillator according to FIG. 6A wherein the DDS clock signal is generated through multiplication of the reference oscillator signal.

FIG. 7 illustrates an oscillator 600 which replicates the oscillator 500 of FIG. 6A and further comprises a power splitter 695 and multiplier 696. In this implementation, the coupler 250 is placed at the output of the mixer 206 for providing the mixer output to the feedback path of the phase lock loop and the output path of the oscillator 600. In particular, the filter 308 is disposed in the feedback path of the phase lock loop for selecting an upper sideband of the output of the mixer 206; and, the filter 380 is disposed in the output path of the oscillator 600 for selecting a lower sideband of the mixer 206. Furthermore, the clock signal for the DDS 409 is derived from the reference signal $F_{ref}$ instead of the VCSO 402. The embodiment improves the stability of the DDS 409 as its set frequency is now independent of the compensation frequency generated by the VCSO 402 whilst retaining the functionality to increase the compensation bandwidth. In an example implementation, the offset mixer 591 can be a double balance mixer or an image reject mixer. In an example implementation the reference signal is 100 MHz and the multiplier 696 scales the reference signal $F_{ref}$ by a factor 10 to provide the DDS 409 with a 1 GHz clock.

Figure 8:
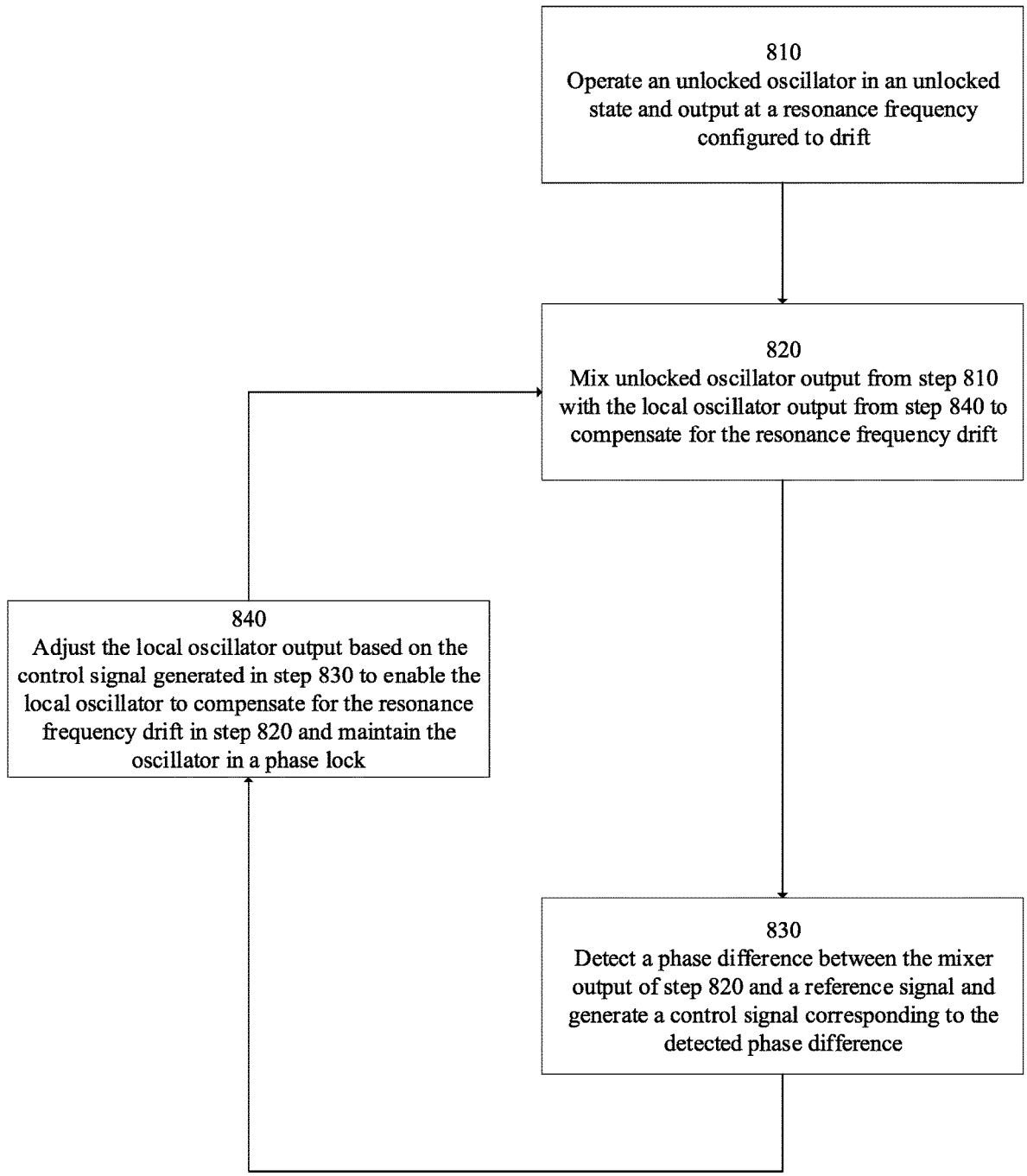
FIG. 8 is block diagram illustrating a method of maintaining an oscillator in a phase lock in accordance with an embodiment of the present disclosure.

FIG. 8 illustrates a flow chart for a method 800 for maintaining a phase lock for an oscillator according to the disclosure herein. The method 800 comprises steps 810, 820, 830, and 840. In particular step 810 includes operating an unlocked oscillator in an unlocked state for outputting at a resonance frequency configured to drift in response to changes in an operating environment; step 820 includes mixing the unlocked oscillator output generated in step 810 with a local oscillator output generated in step 840 to generate a mixer output compensated for the resonance frequency drift; step 830 includes detecting a phase difference between the mixer output of step 820 with a reference signal and further generating a control signal corresponding to the detected phase difference; and, step 840 includes adjusting the local oscillator output based on the control signal generated in step 830 to enable the local oscillator output to compensate for the resonance drift when mixing with the unlocked oscillator output in step 820, thereby maintaining the oscillator in a phase lock.

FIGS. 9-14 are spectrum analyzer plots of an oscillator as disclosed herein.

Figure 9:
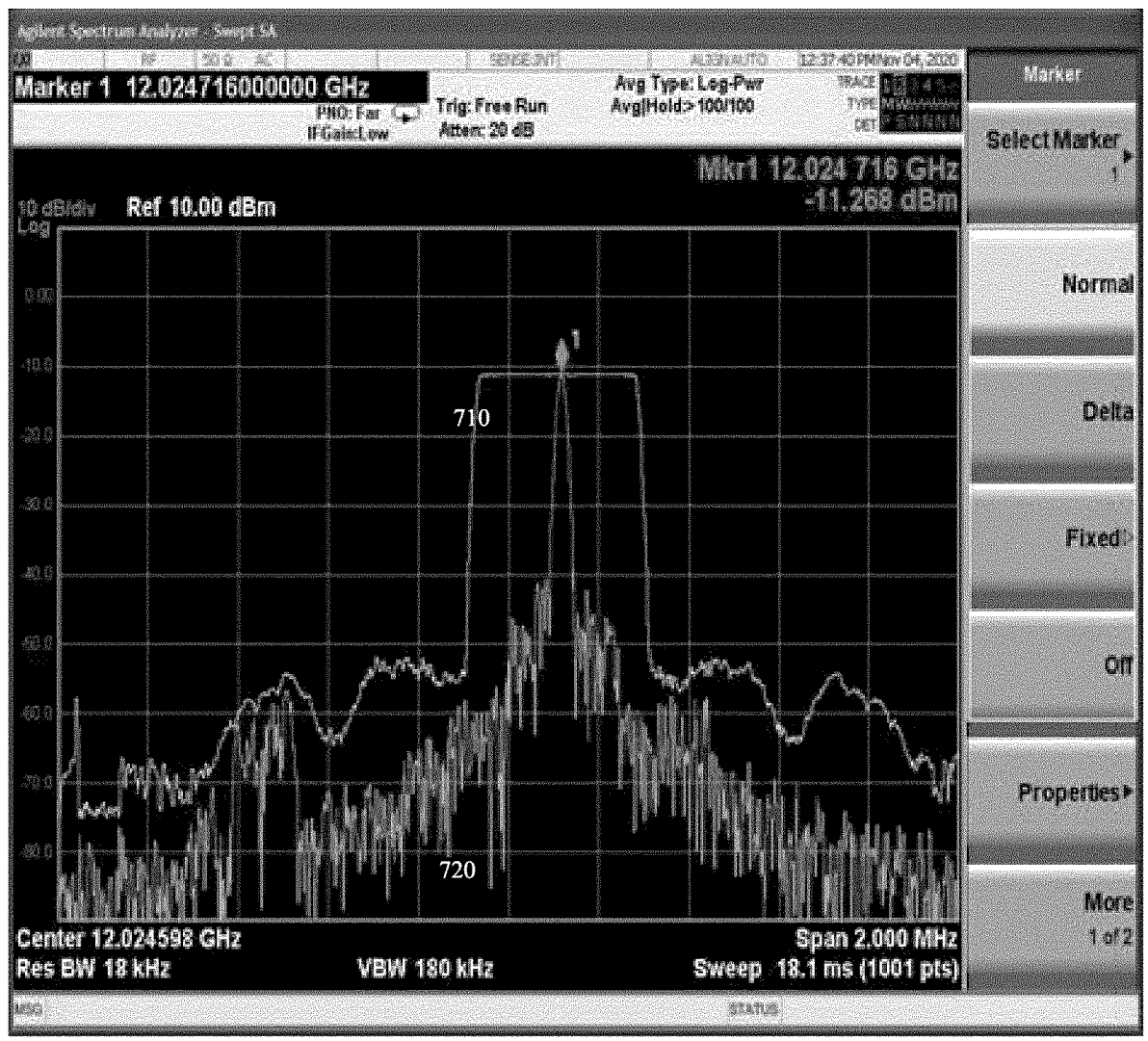
FIG. 9 illustrates two spectrum analyzer plots: one for the unlocked dielectric resonator oscillator under mechanical vibration and a second showing the stabilization effect resulting from application of the method disclosed herein.

FIG. 9 illustrates a first plot 710 and a second plot 720. In particular, the first plot 710 illustrates frequency fluctuations resulting from mechanical vibration of an unlocked oscillator. The spectrum analyzer recording the measurement is placed on max hold equivalent to a long term persistence mode. Simultaneously the second plot 720 illustrates an output from an oscillator in accordance with the disclosure herein that clearly indicates that the mechanical vibration induced noise has been suppressed whereby the oscillator tracks and suppresses the phase and frequency jumps of the unlocked oscillator under mechanical vibration.

Figure 10:
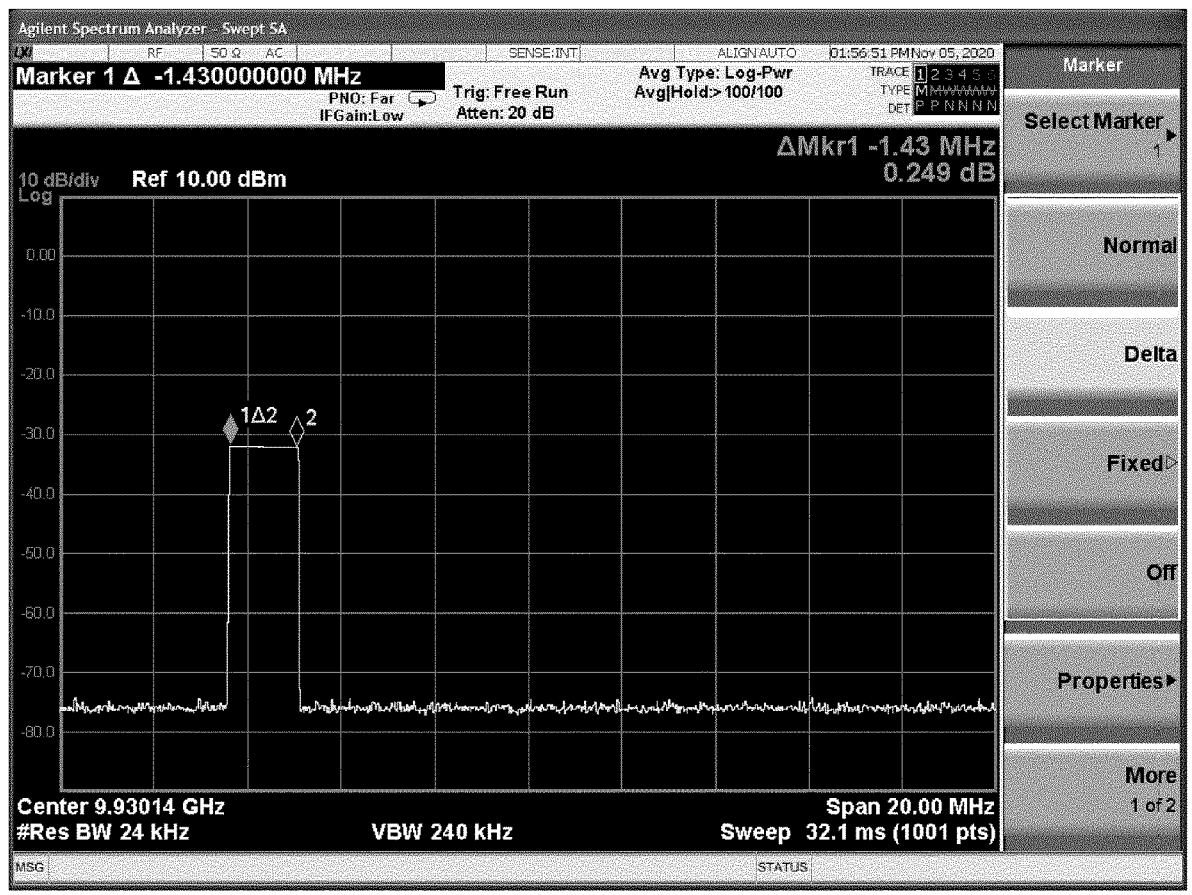
FIG. 10 illustrates a spectrum plot of an unlocked DRO drifting 1.43 MHz as a result of a temperature change from −40° C. to −15° C.

FIG. 10 illustrates a spectrum plot of an unlocked DRO drifting 1.43 MHz as a result of a temperature change from −40° ° C. to −15° C. The spectrum analyzer has been set on maximum hold in order to capture the oscillator frequency drift over the temperature range.

Figure 11:
FIG. 11 illustrates a spectrum plot of an unlocked DRO drifting 6.49 MHz as a result of a temperature change from −15° C. to +85° C.

FIG. 11 illustrates a spectrum plot of an unlocked DRO drifting 6.49 MHz as a result of a temperature change from −15° C. to +85° C. The spectrum analyzer has been set on maximum hold in order to capture the oscillator frequency drift over the temperature range.

Figure 12:
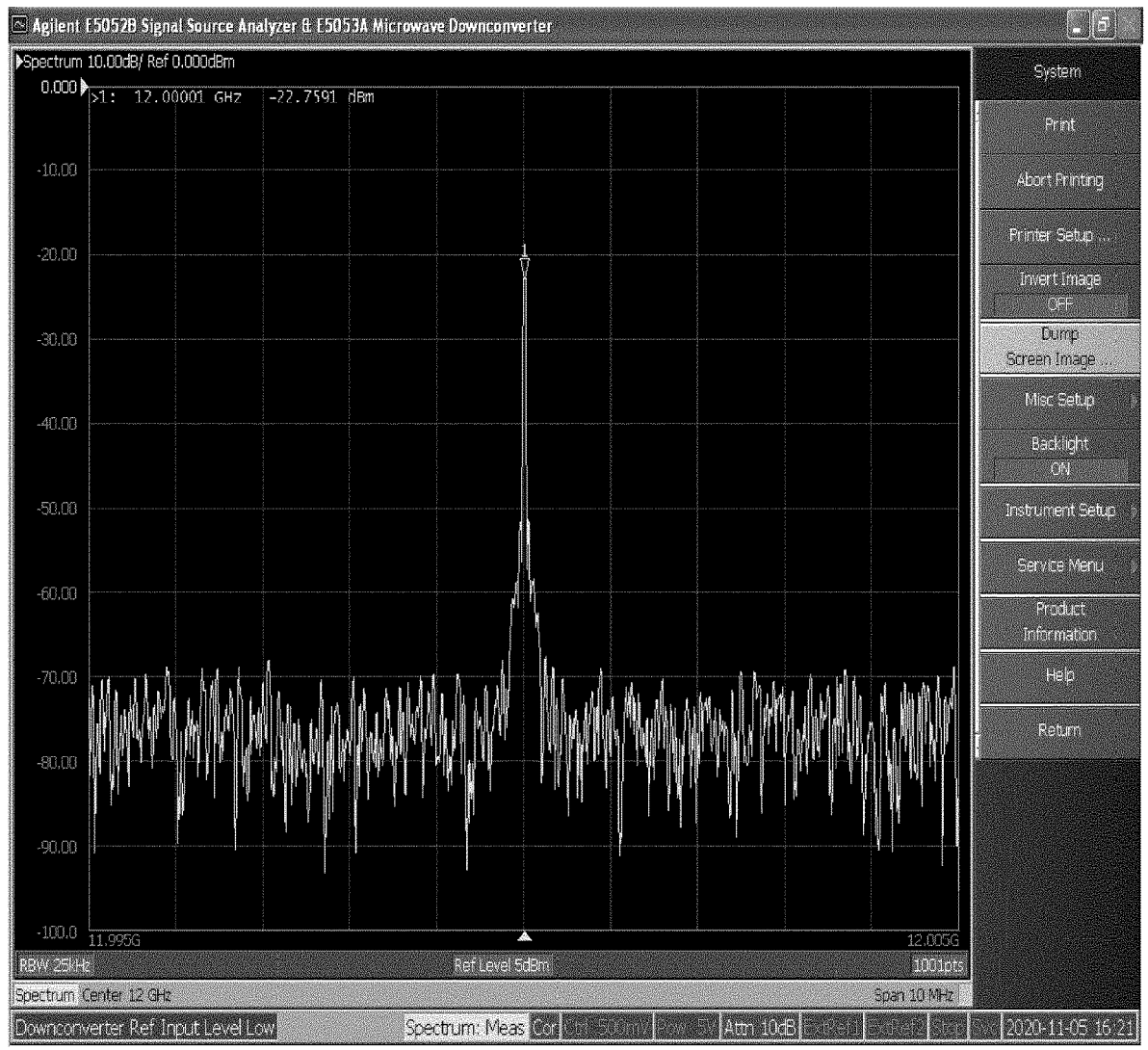
FIGS. 12, 13, and 14 each demonstrate an oscillator as disclosed herein maintaining a lock at 12 GHz as an unlocked DRO drifts in response to changing temperatures −40° C., −15° C., and +85° C., respectively.
Figure 13:
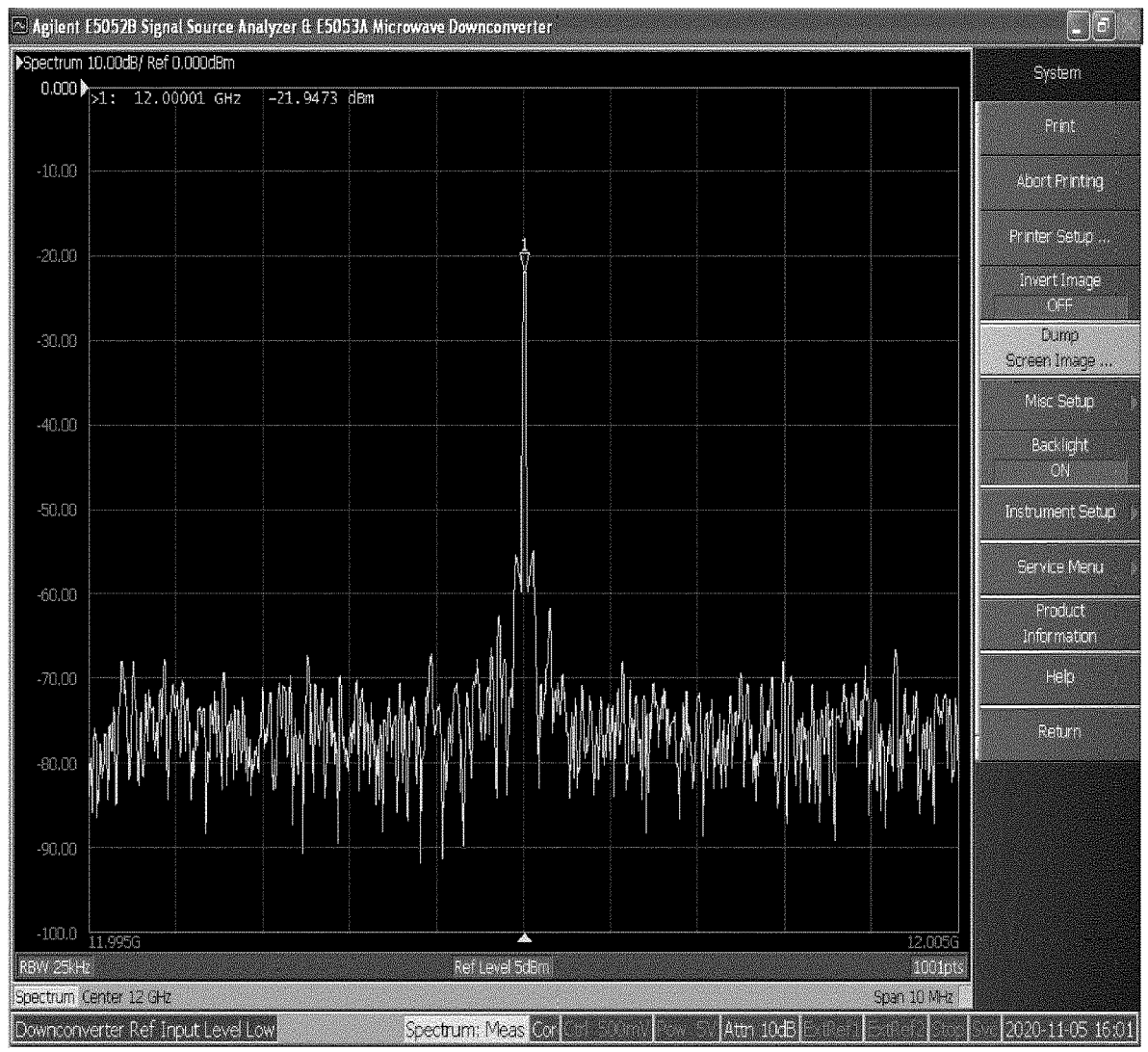
Figure 14:
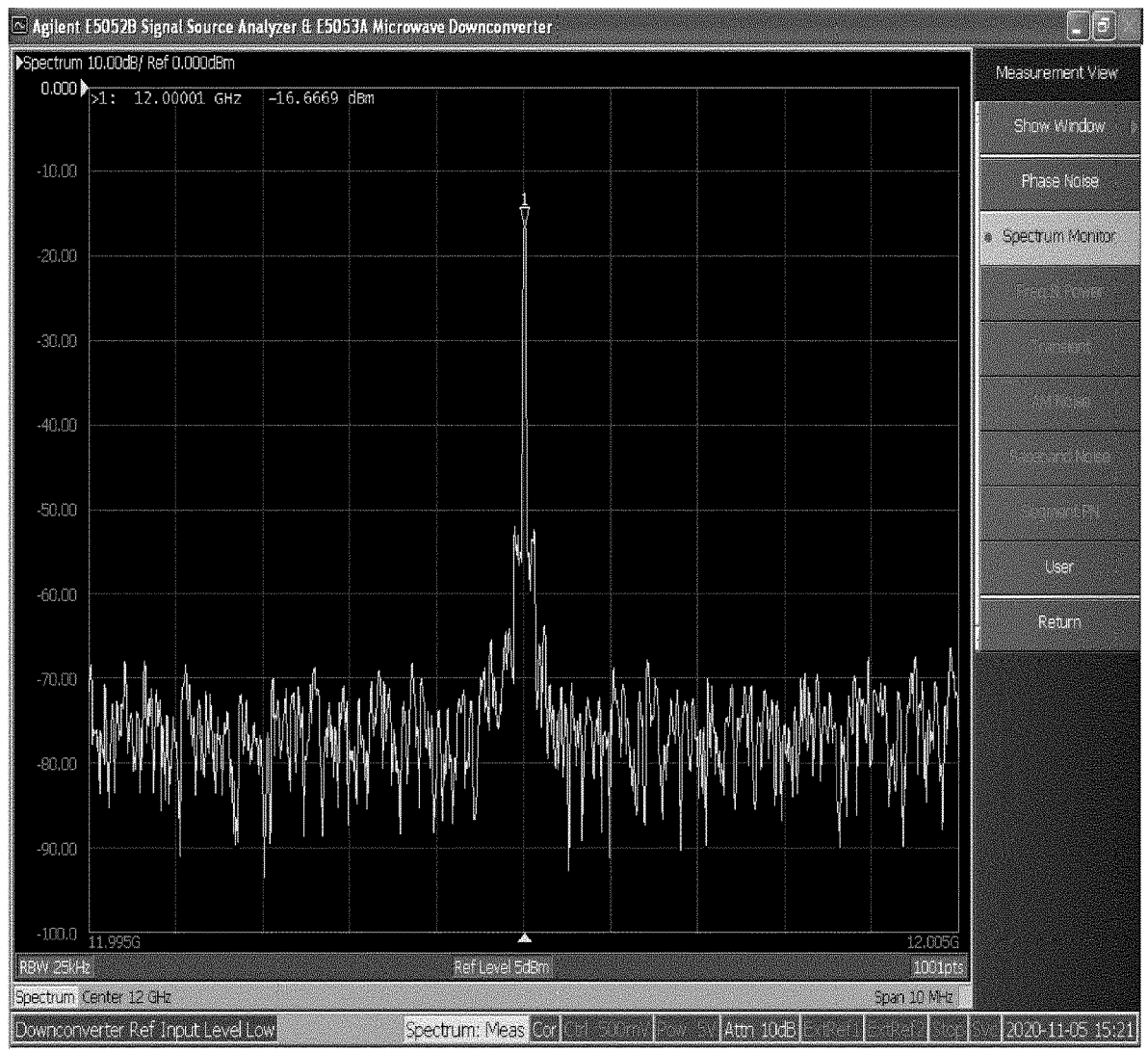

FIGS. 12, 13, and 14 each demonstrate an oscillator as disclosed herein maintaining a lock at 12 GHz as the unlocked DRO drifts in response to changing temperatures −40° C., −15° C., and +85° C., respectively.

Embodiments Having a Drift Compensation Circuit for Offsetting a Drift in Resonance Frequency Phase noise and bandwidth requirements for an oscillator in accordance with the present disclosure may drive different implementations. For example, a low frequency oscillator such as local oscillator 202 or oscillator 402 may introduce phase noise far exceeding the phase noise of the unlocked oscillator, such as the phase noise of the unlocked oscillator 210. As such, the low frequency oscillator becomes the dominant phase noise source, potentially resulting in inadequate phase noise compensation and degraded oscillator performance. One solution may be to use a low frequency oscillator with very low phase noise, such as an oven controlled crystal oscillator (OXCO), to achieve a suitable level of phase noise that does not dominate the phase noise characteristics of the unlocked oscillator. However, a very low phase noise oscillator, such as an OXCO, may lack a suitable tuning bandwidth to track the resonator drift of the unlocked oscillator over a wide temperature range. One solution may include extending a tuning bandwidth of the low phase noise oscillator, as may be accomplished for example in accordance with embodiments of the present disclosure, such as embodiments described and illustrated with respect to FIGS. 5A and 5B. However, a high Q factor resonator—for example, a Q factor in excess of 50,000—may preclude use of a VCSO or OXCO because the VCSO or OXCO will introduce phase noise far exceeding the phase noise characteristics of oscillators based on such high Q factor resonators. Accordingly, other implementations as further disclosed herein may be suitable to address system requirements for phase noise performance, tuning bandwidth, and high Q factor resonators, which themselves may introduce even further design considerations. For example, a sapphire loaded cavity whispering gallery mode resonator may have an unloaded Q factor as high as 200,000 at 10 GHz corresponding to a 3 dB bandwidth of 50 KHz. However, the resonator may have a temperature coefficient as high as 35 ppm/C, whereby a 100 degrees C. change in temperature can cause operation of the resonator at 10 GHz to drift by 35 MHZ, thereby exceeding the 3 dB bandwidth of 50 kHz. Some approaches may employ thermal stabilization using heaters, and a thermal loop to provide the thermal gain necessary to stabilize the system. Problematically however, DC power consumption for such thermal stabilization approaches may reach upwards of 15 watts, limiting application, especially in space and airborne environments where power resources may be scarce.

In an aspect, an oscillator as disclosed herein may implement a phase locked resonator rather than an unlocked oscillator. For example, an oscillator as disclosed herein may comprise a drift compensation circuit and a phase locked loop including a phase locked resonator based oscillator, particularly a high Q factor resonator based oscillator, having a resonance frequency that drifts in response to environmental stimulus, such as in response to temperature changes or mechanical vibrations. Without compensation, the phase locked resonating oscillator may operate offset from its resonance frequency when the resonance frequency drifts in response to the environmental stimulus, resulting in an increase in phase noise and insertion loss. The drift compensation circuit may generate a drift compensation signal based on indicators of environmental stimulus, for use in adjusting operation of the phase locked resonating oscillator to compensate for drift in resonance and to maintain operation of the phased lock resonator at the resonance frequency. More particularly, the drift compensation signal may input to a mixer of the phase locked loop, for mixing with an output of the phase locked resonating oscillator. A phase frequency detector receives the mixing result for use in generating a control signal proportional to a drift in resonance frequency arising from the environmental stimulus. The control signal inputs to the phased locked resonating oscillator for adjusting the oscillator to operate at an offset corresponding to the induced resonator drift, thereby maintaining operation of the phase locked resonating oscillator at the resonance frequency, minimizing phase noise, and minimizing insertion loss. In an embodiment, the drift compensation circuit generates a drift compensation signal further comprising a sideband offset for relaxing filter bandwidth requirements. For example, mixing the resonating oscillator output with the drift compensation signal may result in sideband outputs having a frequency separation corresponding to the drift offset, which may induce narrow bandwidth requirements in subsequent filters, such as requiring bandpass filters to have narrow passbands to provide adequate filtering of the mixer output. Further incorporating a sideband offset into the drift compensation signal can increase a frequency separation between the mixer sideband outputs, thereby relaxing bandwidth requirements for filtering the mixer output.

Embodiments of method for compensating for resonance drift in accordance with the present disclosure may include the following steps: maintaining a resonating oscillator in a phase lock with an external reference, the resonating oscillator comprising a resonator having a resonance frequency drifting in response to an environmental stimulus; generating a drift compensation signal comprising a drift offset based on an indicator of a drift in the resonance frequency; generating a mixer output for offsetting the drift in the resonance frequency based on mixing a resonating oscillator output with the drift compensation signal; detecting a phase difference between the mixer output and the external reference, and tuning operation of the resonating oscillator based on the detected phase difference to maintain operation of the resonating oscillator at the resonant frequency.

Figure 15:
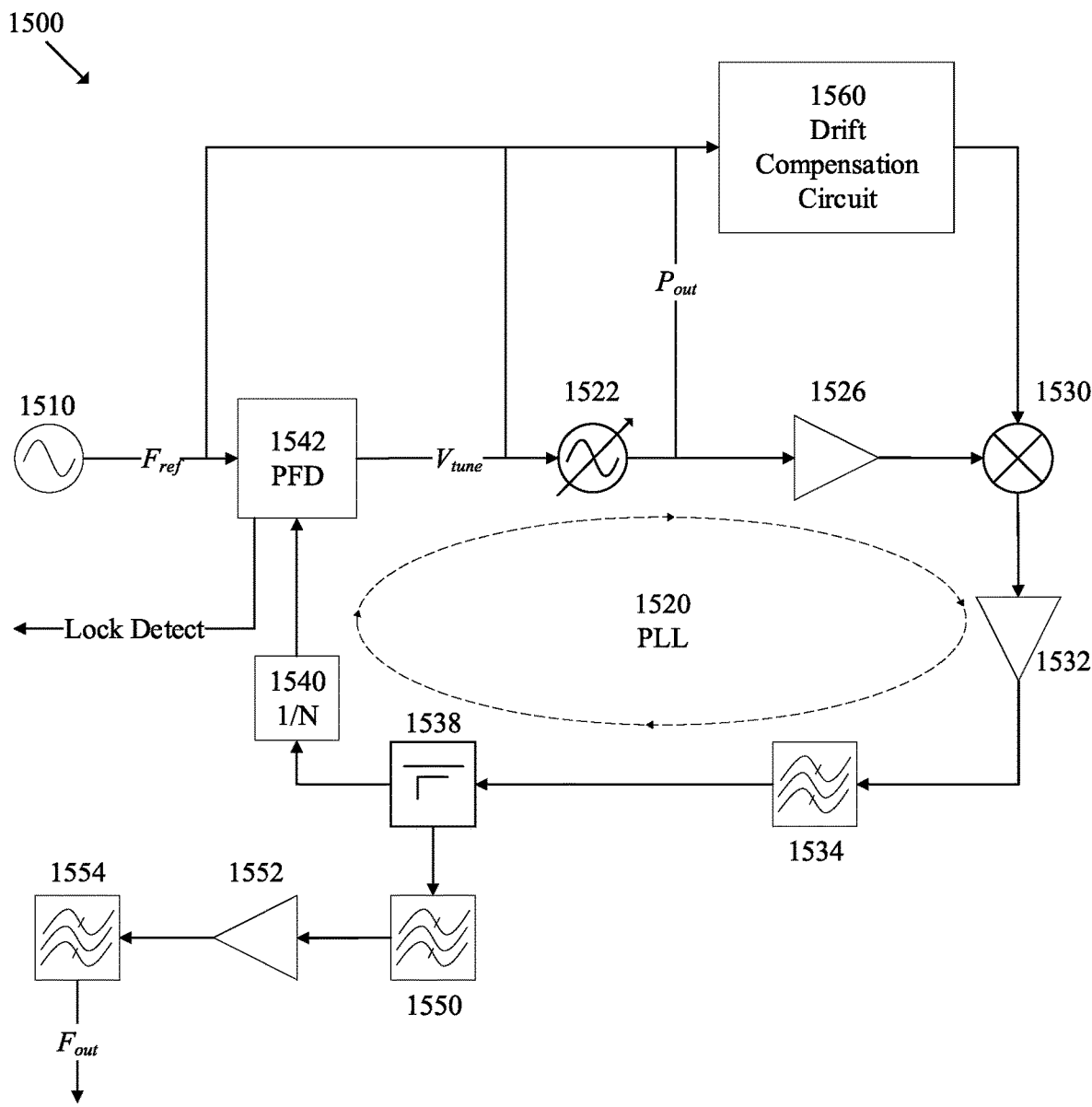
FIG. 15 illustrates an embodiment of an oscillator in accordance with the present disclosure, comprising a phase locked resonating oscillator and a drift compensation circuit.

FIG. 15 illustrates an embodiment of an oscillator 1500 in accordance with the present disclosure. The oscillator 1500 generally includes a drift compensation circuit 1560 to compensate for a drift in a resonance frequency, and a phase lock loop 1520 for maintaining a resonating oscillator, such as a high Q factor resonator based oscillator, in phase lock with an external reference $F_{ref}$ as may be provided by an external source 1510. Embodiments of an external source 1510 may include an external crystal reference oscillator. A typical reference signal $F_{ref}$ may have a frequency anywhere from 10 MHz to 1 GHz however, those skilled in the art will appreciate that the reference signal is based on desired parameters for the application or task at hand.

The phase lock loop 1520 generally includes the resonating oscillator 1522, mixer 1530, bandpass filter 1534, and phase frequency detector 1542. The phase lock loop 1520 may further includes amplifiers to compensate for loss, such as the amplifiers 1526 and 1532, and may further include a feedback divider 1540, to meet system requirements that may require scaling the output $F_{out}$ down to a scale of the input reference signal $F_{ref}$. A coupler 1538 may be included within the loop 1520 to couple the mixer output to an output path of the oscillator 1500. The output path of the oscillator may further include first and second bandpass filters 1550 and 1554, respectively, and an amplifier 1552.

The phase lock loop 1520 maintains the resonating oscillator 1522 in a phase lock with the reference signal $F_{ref}$. Environmental stimulus may however induce a change in the resonance frequency of the resonating oscillator 1522, causing it to maintain a phase lock offset from its resonance frequency in the absence of compensation. Operating offset from the resonance frequency is undesirable as it may result in higher phase noise and higher insertion loss, degrading performance of the oscillator 1500. To compensate for a drift in resonance frequency, the phase lock loop includes a mixer 1530 for mixing an output of the resonating oscillator 1522 with an output of the drift compensation circuit 1560. The drift compensation circuit 1560 may provide an output, such as a drift compensation signal, comprising a drift offset to compensate for a drift in resonance frequency. In an embodiment, the drift offset is generated based on an indicator of environmental stimulus, as described further herein. Embodiments of a drift compensation circuit 1560 as described herein may include generating a drift compensation signal further comprising a sideband offset. The sideband offset may be generated to improve a frequency separation between sideband outputs of a mixer, such as the sideband outputs of the mixer 1530, which may further relax bandwidth requirements for filtering a mixer output. For example, in the absence of a filter offset, the mixer 1530 may output at sidebands having minimal frequency separation, inducing narrow bandwidth requirements on subsequent filters, such as the bandpass filter 1534. A drift compensation signal further comprising a filter offset may however increase a frequency separation between the mixer sideband outputs, thereby relaxing passband requirements in the bandpass filter 1534.

Figure 16:
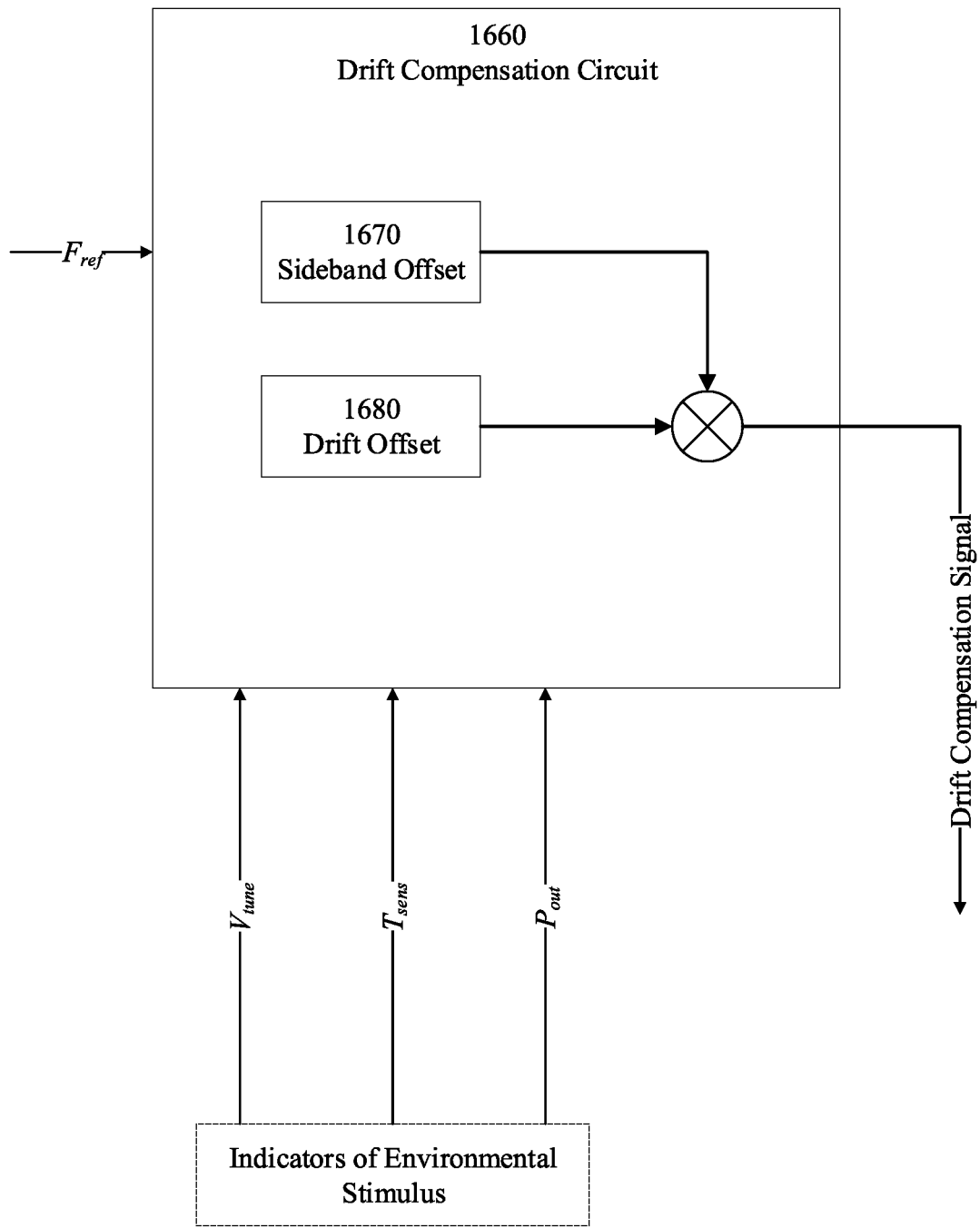
FIG. 16 illustrates an embodiment of a drift compensation circuit in accordance with the present disclosure.

FIG. 16 illustrates an embodiment of a drift compensation circuit in accordance with the present disclosure. The drift compensation circuit 1660 may receive a plurality of inputs for use in generating a drift compensation signal based on mixing a sideband offset 1670 and a drift offset 1680. The plurality of inputs may include the reference signal $F_{ref}$ for use in generating the sideband offset 1670. In an embodiment, the sideband offset is a scale multiple of the reference signal $F_{ref}$. In an embodiment, the sideband offset is a scale factor of 10 greater than the reference frequency. In an embodiment, the reference frequency is 100 MHZ, and the sideband offset is 1000 MHz. The plurality of inputs may also include one or more indicators of an environmental stimulus, which may be used for generating the drift offset 1680. The plurality of indicators of the environmental stimulus includes parameters that may reflect or correspond to changes in temperature or mechanical vibrations. Indicators of an environmental stimulus may include, but are not limited to, a control voltage $V_{tune}$ for controlling operation of a resonating oscillator, a temperature reading $T_{sens}$ as may be provided by a temperature sensor, and a power output $P_{out}$ as may be determined from an output of a resonating oscillator. In an embodiment, the drift compensation circuit 1670 generates the drift offset to compensate for a drift in resonance frequency. In an embodiment, the resonator may drift upwards of a 100 MHZ, and the drift offset may be generated to offset substantially the same.

Figure 17:
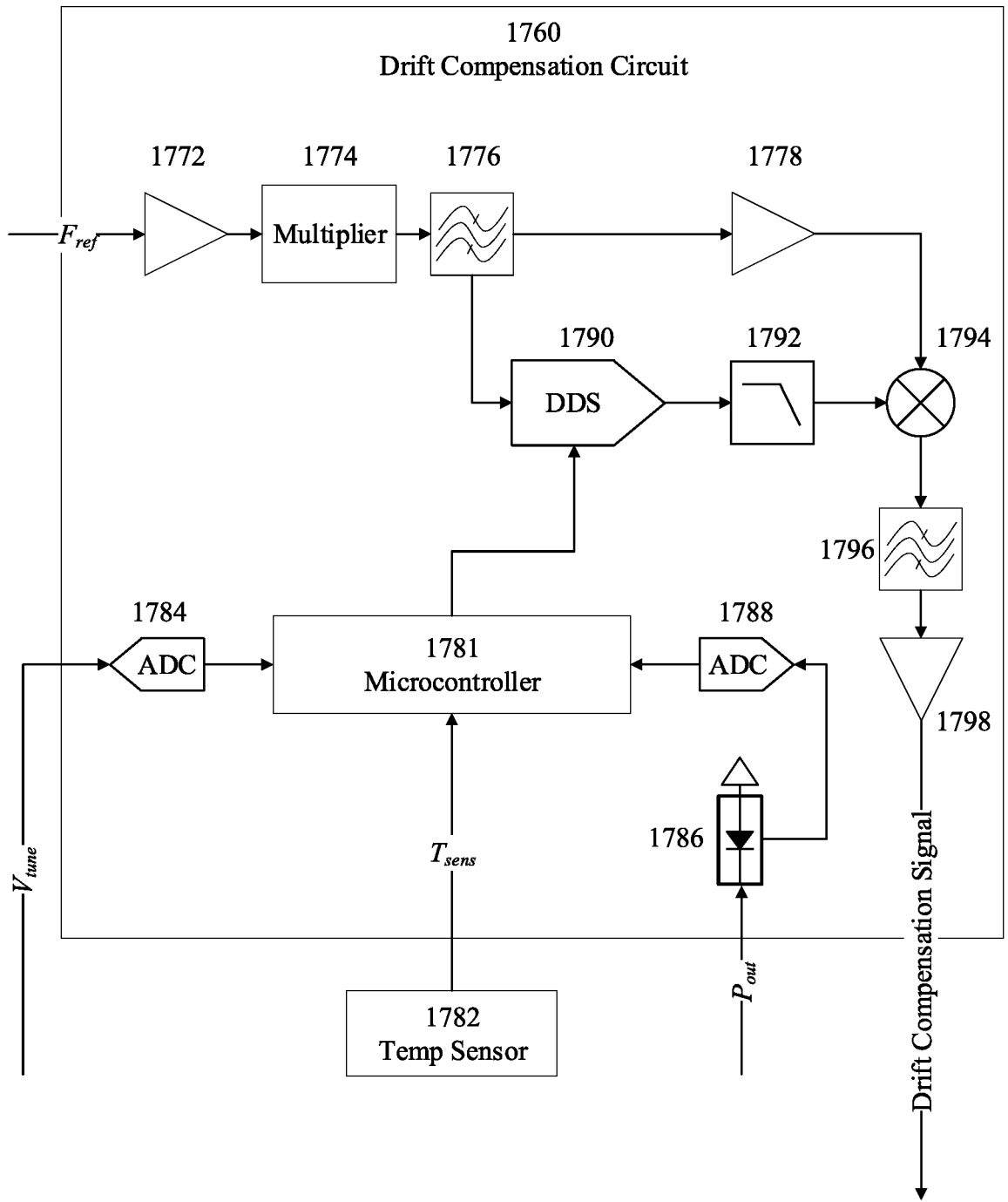
FIG. 17 illustrates an embodiment of a drift compensation circuit in accordance with the present disclosure.

FIG. 17 illustrates an embodiment of a drift compensation circuit in accordance with the present disclosure. The drift compensation circuit 1770 provides a drift compensation signal comprising a sideband offset and a drift offset. In operation, the drift circuit 1770 receives the reference signal $F_{ref}$ and may further input it to a series of elements which may include an amplifier 1772, multiplier 1774, filter 1776, and an amplifier 1778 for generating the sideband offset. For example, the multiplier 1774 may scale a reference frequency of the reference signal $F_{ref}$ to generate the sideband offset. Furthermore, a scale of the reference frequency may be provided as the clock for the DDS 1790. For example, the output of the filter 1776 may be provided as the clock signal to the DDS 1790. Accordingly, the reference frequency may serve as a basis for generating the sideband offset and for setting the DDS clock.

The drift compensation circuit 1760 may further include a microcontroller 1781 for controlling operation of the DDS 1790 to output a drift offset for compensating a drift in a resonance frequency of a resonating oscillator. Embodiments of the microcontroller 1781 may control operations of the DDS 1790 based on indicators of an environmental stimulus which may include, but are not limited to, a control voltage $V_{tune}$ for controlling operation of the resonating oscillator, a temperature reading $T_{sens}$ as may be provided by a temperature sensor, and a power output $P_{out}$ as may be determined from an output of the resonating oscillator. For example, the microcontroller 1781 may be configured to exploit knowledge of the fact that a resonating oscillator provides optimal phase noise when operating at its resonance frequency and otherwise provides sub-optimal phase noise when drifting off its resonance frequency. Knowledge of the control voltage $V_{tune}$ required to operate a particular resonance frequency may indicate whether a voltage controlled resonating oscillator is operating at the particular resonance frequency. The microcontroller 1781 can thus evaluate a change in a control voltage $V_{tune}$ to determine a drift in resonance frequency arising from environmental stimulus. In an embodiment, the drift compensation circuit 1760 receives and inputs the control voltage $V_{tune}$ into an analog-to-digital converter 1784 for generating a quantized control voltage for further input to the microcontroller 1781. The microcontroller 1781 may evaluate the quantized control voltage to determine whether it reflects operation of the voltage-controlled resonating oscillator at an optimal phase noise for a particular resonance frequency. If the quantized control voltage has drifted, the microcontroller 1781 may provide an output for adjusting operation of the DDS 1790 to output a drift offset to compensate for a drift in the resonance frequency. Accordingly, the microcontroller 1781 may generate an output based on the control voltage $V_{tune}$ for adjusting operation of the DDS 1790 to output a drift offset to compensate for a drift in resonance frequency. Similarly, an output power $P_{out}$ of a resonating oscillator may serve as an indicator for a drift in resonance frequency arising from environmental stimulus. The microcontroller 1781 may exploit knowledge of the fact that the maximum power output of a resonating oscillator corresponds to the minimum phase noise operation point as a result of the closest operation to resonance and highest oscillator loop power. In an embodiment, the drift compensation circuit 1760 may include a power detector 1786 for detecting an output power of the resonating oscillator, and an analog-to-digital converter 1788 for quantizing the detected output power. The quantized power level may be provided as an input to the microcontroller 1781 for evaluating whether the resonating oscillator is operating at maximum power output, for use in adjusting operation of the DDS 1790 to output a drift offset for compensating for a drift in resonance frequency. Accordingly, the microcontroller 1781 may generate an output based on an output power $P_{out}$ for adjusting operation of the DDS 1790 to output a drift offset to compensate for a drift in resonance frequency. Embodiments of a drift compensation circuit 1760 may include providing a low-pass filter 1792 at an output of the DDS 1790, for filter a drift offset generated by the DDS 1790.

Systems and methods for a drift compensation circuit 1760 as disclosed herein may include a step of calibration to determine a temperature look-up table for a resonating oscillator and its corresponding resonance frequency drift. Embodiments of a drift compensation circuit 1760 may thus include a microcontroller 1781 configured with a look-up table to determine a drift in resonance frequency based on a temperature reading $T_{sens}$ from a temperature sensor, such as from the temperature sensor 1782, which measures a temperature of the resonating oscillator. The microcontroller 1781 may then provide an output for adjusting operation of the DDS 1790 to output a drift offset to compensate for a drift in resonance frequency based on the resonance drift corresponding to the temperature reading in the look-up table.

Embodiments of a drift compensation circuit 1760 may include a mixer 1794 for receiving and mixing a first offset and a second offset. The first offset may correspond to a drift offset as may be generated by a DDS 1790; and, the second offset may correspond to a sideband offset corresponding to a scale of a reference frequency of the reference signal $F_{ref}$, as may be generated for example from a multiplier 1774. The mixer 1794 may thus generate a drift compensation signal comprising first and second offsets, for further input to a mixer of a phase lock loop. The drift compensation circuit 1796 may further comprise a bandpass filter 1796 and an amplifier 1798 at an output of the mixer 1794, for filtering the mixer output and compensating for loss, respectively.

As an illustrative example, an oscillator as disclosed herein, such as the oscillator 1500, may receive an input from an external crystal reference fixed at 100 MHZ, may include a phase lock loop 1520 having a voltage-controlled dielectric resonating oscillator 1522 drifting between 9.1 GHZ, and 9.2 GHz in response to environmental stimulus, may have a system requirement to provide an output $F_{out}$ at 10 GHZ, and may set a divide ratio N of the feedback divider 1540 to a factor of 100 to provide appropriate scaling between the output $F_{out}$ and the input reference $F_{ref}$. In such an implementation, the drift compensation circuit, such as the drift compensation circuit 1560, 1660, 1760, may be configured as follows. The drift compensation circuit may be configured to generate a drift compensation signal to include a sideband offset at 1000 MHz, for offsetting the resonator output to meet the 10 GHz system requirement. Accordingly, the multiplier 1774 may be set to a factor of 10 to scale the 100 MHz reference frequency of the reference signal $F_{ref}$ to a 1000 MHz offset for mixing with an output of the resonating oscillator 1522 at the mixer 1530. Additionally, the 1000 MHz sideband offset increases a frequency separation at mixer sidebands, advantageously relaxing passband requirements in subsequent steps of filtering, such as for the bandpass filter 1534, and may thus enable the use of low cost microstrip or LTCC filter technology which may for example be used to select an upper sideband from the mixing product of the mixer 1530. Furthermore, the 1000 MHz offset may be provided as the clock signal to the DDS 1790. Based on indicators of environmental stimulus, the microcontroller 1781 may output a control signal, such as a divide ratio, for adjusting operation of the DDS 1790 to provide a drift offset to compensate for a drift in resonance frequency. In consideration of an expected drift between 9100 MHz and 9200 MHz, the microcontroller 1781 may be configured to adjust operation of the DDS 1790 to provide a corresponding drift offset between 100 MHz and 200 MHz to compensate for drift in the resonating oscillator 1522. Accordingly, the drift compensation circuit may generate a drift compensation signal comprising a sideband offset (e.g. 1000 MHz) and a drift offset (e.g. 100 MHz to 200 MHZ), for mixing with an output of the resonating oscillator 1522 at the mixer 1530. Phase noise requirements however may drive different implementations. For example, system output requirements may drive the multiplier 1774 to operate with increasingly higher scale factors, increasing phase noise at the multiplier 1774. As such, it may be the case that the multiplier 1774 can no longer meet phase noise requirements for the system, and a different resonator should be implemented with a view to relaxing scale factor and phase noise requirements at the multiplier 1774. For example, a system output requirement of 11 GHz may induce the multiplier to implement a scale factor in the order of 20 and thereby generate phase noise at levels beyond system requirements. Accordingly, rather than increasing a scale of the multiplier 1774, it may be necessary to replace the resonator in the resonating oscillator 1522 with a resonator having a higher center frequency. Similarly, though a low pass filter 1792 may filter an output of the DDS 1790 to improve phase noise performance, operation of the DDS 1790 should remain at low enough outputs to avoid contaminating an output of the resonating oscillator as may arise through mixing operations at the mixer 1530. As such, careful selection of components should be made to achieve adequate phase noise performance in consideration of overall system requirements.

Figure 18:
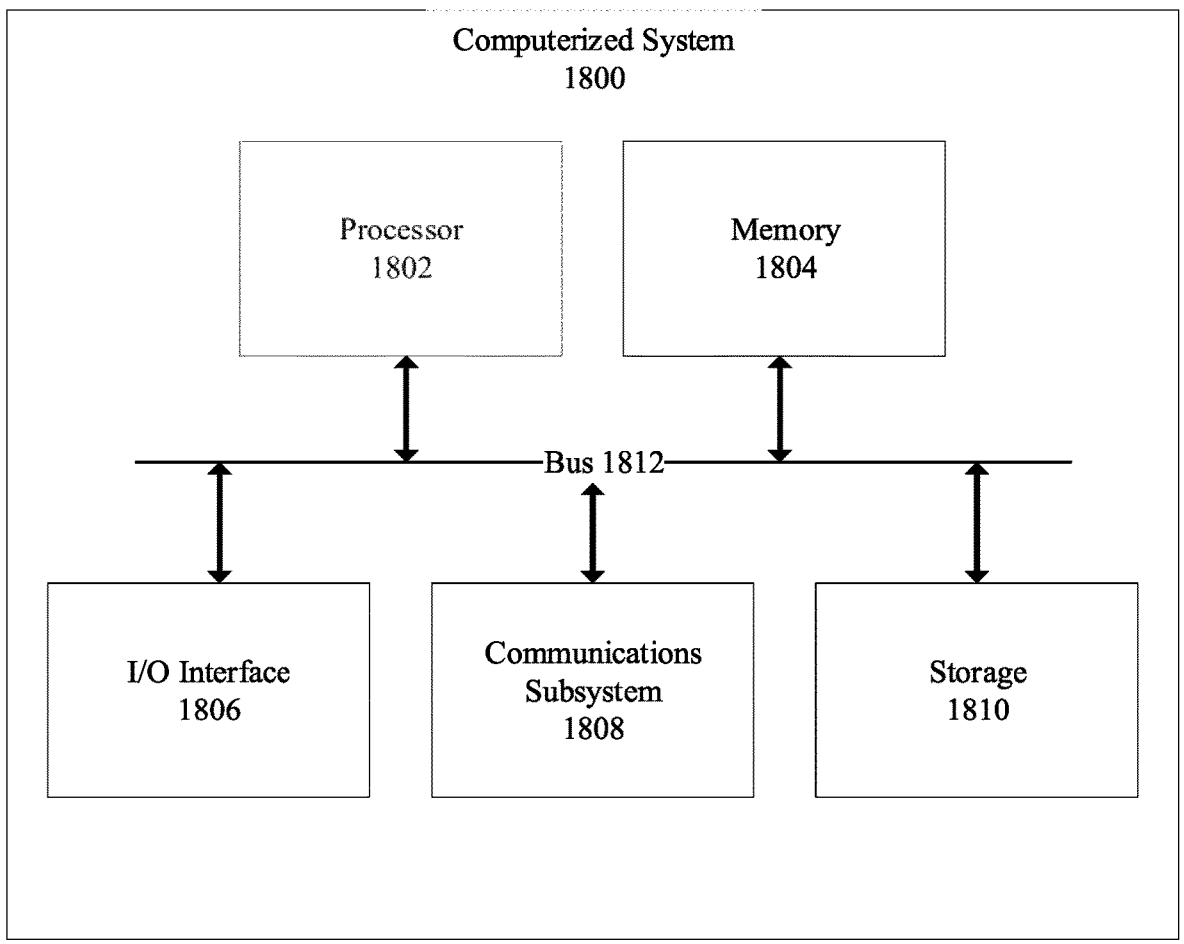
FIG. 18 is a block diagram of an example computing device or system for implementing a system and/or method for an oscillator in accordance with the present disclosure.

FIG. 18 is a block diagram of an example computerized device or system 1800 that may be used in implementing one or more aspects, embodiments, components, or sub-components of a system and/or method for an oscillator as disclosed herein.

Computerized system 1800 may include one or more of a processor 1802, memory 1804, a mass storage device 1810, an input/output (I/O) interface 1806, and a communications subsystem 1808. Further, system 1800 may comprise multiples, for example multiple processors 1802, and/or multiple memories 1804, etc. Processor 1802 may comprise one or more of a digital processor, an analog processor, a digital circuit designed to process information, an analog circuit designed to process information, a state machine, and/or other mechanisms for electronically processing information. These processing units may be physically located within the same device, or the processor 1802 may represent processing functionality of a plurality of devices operating in coordination. The processor 1802 may be configured to execute modules by software; hardware; firmware; some combination of software, hardware, and/or firmware; and/or other mechanisms for configuring processing capabilities on the processor 1802, or to otherwise perform the functionality attributed to the module and may include one or more physical processors during execution of processor readable instructions, the processor readable instructions, circuitry, hardware, storage media, or any other components.

One or more of the components or subsystems of computerized system 1800 may be interconnected by way of one or more buses 1812 or in any other suitable manner.

The bus 1812 may be one or more of any type of several bus architectures including a memory bus, storage bus, memory controller bus, peripheral bus, or the like. The CPU 1802 may comprise any type of electronic data processor. The memory 1804 may comprise any type of system memory such as dynamic random access memory (DRAM), static random access memory (SRAM), synchronous DRAM (SDRAM), read-only memory (ROM), a combination thereof, or the like. In an embodiment, the memory may include ROM for use at boot-up, and DRAM for program and data storage for use while executing programs.

The mass storage device 1810 may comprise any type of storage device configured to store data, programs, and other information and to make the data, programs, and other information accessible via the bus 1812. The mass storage device 1810 may comprise one or more of a solid state drive, hard disk drive, a magnetic disk drive, an optical disk drive, or the like. In some embodiments, data, programs, or other information may be stored remotely, for example in the cloud. Computerized system 1800 may send or receive information to the remote storage in any suitable way, including via communications subsystem 1808 over a network or other data communication medium.

The I/O interface 1806 may provide interfaces for enabling wired and/or wireless communications between computerized system 1800 and one or more other devices or systems. For instance, I/O interface 1806 may be used to communicatively couple with sensors, such as cameras or video cameras. Furthermore, additional or fewer interfaces may be utilized. For example, one or more serial interfaces such as Universal Serial Bus (USB) (not shown) may be provided.

Computerized system 1800 may be used to configure, operate, control, monitor, sense, and/or adjust devices, systems, and/or methods according to the present disclosure.

A communications subsystem 1808 may be provided for one or both of transmitting and receiving signals over any form or medium of digital data communication, including a communication network. Examples of communication networks include a local area network (LAN), a wide area network (WAN), an inter-network such as the Internet, and peer-to-peer networks such as ad hoc peer-to-peer networks. Communications subsystem 1808 may include any component or collection of components for enabling communications over one or more wired and wireless interfaces. These interfaces may include but are not limited to USB, Ethernet (e.g. IEEE 802.3), high-definition multimedia interface (HDMI), Firewire™ (e.g. IEEE 1394), Thunderbolt™, WiFi™ (e.g. IEEE 802.11), WiMAX (e.g. IEEE 802.16), Bluetooth™, or Near-field communications (NFC), as well as GPRS, UMTS, LTE, LTE-A, and dedicated short range communication (DSRC).

Communication subsystem 1808 may include one or more ports or other components (not shown) for one or more wired connections. Additionally or alternatively, communication subsystem 1808 may include one or more transmitters, receivers, and/or antenna elements (none of which are shown).

Computerized system 1800 of FIG. 18 is merely an example and is not meant to be limiting. Various embodiments may utilize some or all of the components shown or described. Some embodiments may use other components not shown or described but known to persons skilled in the art.

In the preceding description, for purposes of explanation, numerous details are set forth in order to provide a thorough understanding of the embodiments. However, it will be apparent to one skilled in the art that these specific details are not required. In other instances, well-known electrical structures and circuits are shown in block diagram form in order not to obscure the understanding. For example, specific details are not provided as to whether the embodiments described herein are implemented as a software routine, hardware circuit, firmware, or a combination thereof.

Embodiments of the disclosure can be represented as a computer program product stored in a machine-readable medium (also referred to as a computer-readable medium, a processor-readable medium, or a computer usable medium having a computer-readable program code embodied therein). The machine-readable medium can be any suitable tangible, non-transitory medium, including magnetic, optical, or electrical storage medium including a diskette, compact disk read only memory (CD-ROM), memory device (volatile or non-volatile), or similar storage mechanism. The machine-readable medium can contain various sets of instructions, code sequences, configuration information, or other data, which, when executed, cause a processor to perform steps in a method according to an embodiment of the disclosure. Those of ordinary skill in the art will appreciate that other instructions and operations necessary to implement the described implementations can also be stored on the machine-readable medium. The instructions stored on the machine-readable medium can be executed by a processor or other suitable processing device, and can interface with circuitry to perform the described tasks.

The above-described embodiments are intended to be examples only. Alterations, modifications and variations can be effected to the particular embodiments by those of skill in the art without departing from the scope, which is defined solely by the claims appended hereto.

What is claimed is:

1. An oscillator, comprising:
   an oscillator input port for receiving a reference signal;
   an oscillator output port for outputting an oscillator output;
   an unlocked oscillator configured to oscillate in an unlocked state and output at a resonance frequency configured to drift in response to changes in an operating environment, and a phase locked loop (PLL), comprising:
   a mixer having an output port configured to output the unlocked oscillator output mixed with an output of a local oscillator, the mixer output port being in communication with a phase frequency detector and the oscillator output port, and the phase frequency detector being configured to generate a control signal based on a detected phase difference between the reference signal and the mixer output;
wherein the control signal adjusts the local oscillator output to compensate for the resonance frequency drift of the unlocked oscillator when mixed with the unlocked oscillator output;
wherein the local oscillator has a tuning bandwidth selected to span a drift bandwidth of the unlocked oscillator.

2. The oscillator of claim 1, wherein the phase locked loop further comprises a feedback divider coupled between the mixer output port and the phase frequency detector, the feedback divider configured to provide the mixer output, to the phase frequency detector, divided by a divide ratio N.

3. The oscillator of claim 1, wherein the unlocked oscillator is selected from the group consisting of: a surface acoustic wave (SAW) oscillator; a dielectric resonator oscillator (DRO); an opto-electronic oscillator (OEO); a sapphire loaded cavity oscillator (SLCO); and a Bragg resonator oscillator (BRO).

4. An oscillator, comprising:
an oscillator input port for receiving a reference signal;
an oscillator output port for outputting an oscillator output;
an unlocked oscillator configured to oscillate in an unlocked state and output at a resonance frequency configured to drift in response to changes in an operating environment, and
a phase locked loop (PLL), comprising:
a local oscillator having a tuning bandwidth;
a direct digital synthesizer (DDS) in communication with an output of the local oscillator, the direct digital synthesizer (DDS) configured to divide the local oscillator output by a divide ratio R;
a first mixer having an output port configured to output the unlocked oscillator output mixed with an output of the DDS, the first mixer output port being in communication with a phase frequency detector and the oscillator output port, and
the phase frequency detector being configured to generate a control signal for adjusting the local oscillator output, the control signal based on a detected phase difference between the reference signal and the first mixer output;
wherein the divide ratio R is between a first divide ratio R1 and a second divide ratio R2, the first and second divide ratios selected for extending the tuning bandwidth to be greater than a drift bandwidth of the unlocked oscillator.

5. The oscillator of claim 4, wherein the PLL further comprises:
an analog-to-digital converter (ADC) configured to receive and digitize the control signal, and
a microcontroller in communication with the ADC and the DDS, the microcontroller configured to set the divide ratio of the DDS based on the digitized control signal.

6. The oscillator of claim 4, wherein the PLL further comprises a feedback divider coupled between the first mixer output port and the phase frequency detector, the feedback divider configured to provide the first mixer output, to the phase frequency detector, divided by a divide ratio N.

7. An oscillator, comprising:
an oscillator input port for receiving a reference signal;
a multiplier in communication with the oscillator input port for outputting the reference signal scaled by a factor X;
an oscillator output port for outputting an oscillator output;
an unlocked oscillator configured to oscillate in an unlocked state and output at a resonance frequency configured to drift in response to changes in an operating environment, and
a phase locked loop (PLL), comprising:
a local oscillator having a tuning bandwidth;
a direct digital synthesizer (DDS) in communication with the multiplier output, the direct digital synthesizer (DDS) configured to divide the multiplier output by a divide ratio R;
a first mixer having an output port configured to output an output of the local oscillator mixed with an output of the DDS, for offsetting the local oscillator output by the DDS output;
a second mixer having an output port configured to output the first mixer output mixed with the unlocked oscillator output, the second mixer output port being in communication with a phase frequency detector and the oscillator output port, and
the phase frequency detector being configured to generate a control signal for adjusting the local oscillator output, the control signal based on a detected phase difference between the reference signal and the first mixer output;
wherein the PLL further comprises:
an analog-to-digital converter (ADC) configured to receive and digitize the control signal, and
a microcontroller in communication with the ADC and the DDS, the microcontroller configured to set the divide ratio of the DDS based on the digitized control signal.

8. An oscillator, comprising:
an oscillator input port for receiving a reference signal;
a phase lock loop including a resonating oscillator comprising a resonator having a resonance frequency drifting in response to an environmental stimulus, the phase lock loop maintaining the resonating oscillator in a phase lock with the reference signal;
a drift compensation circuit for generating a drift compensation signal comprising a drift offset based on an indicator of a drift in the resonance frequency of the resonator;
a mixer in communication with the resonating oscillator and the drift compensation circuit and configured to provide a mixer output comprising a resonating oscillator output offset based on the drift compensation signal;
a phase frequency detector in communication with the mixer and the oscillator input port and configured to detect a phase difference between the reference signal and the mixer output for generating a control signal for tuning the resonating oscillator, and
an oscillator output port for outputting an oscillator output comprising the mixer output.

9. The oscillator of claim 8, wherein the drift compensation circuit generates a sideband offset, wherein the drift compensation signal further comprises the sideband offset for increasing a frequency separation between the resonating oscillator output and the mixer output.

10. The oscillator of claim 9, wherein the drift compensation circuit comprises a mixer for generating the drift compensation signal based on mixing the drift offset and the sideband offset.

11. The oscillator of claim 9, wherein the drift compensation circuit is in communication with the oscillator input port for generating the sideband offset based on scaling a reference frequency of the reference signal.

12. The oscillator of claim 11, wherein the drift compensation circuit further comprises:
a direct digital synthesizer (DDS) for generating the drift offset, the DDS having a clock set based on the scaled reference frequency, and
a microcontroller for adjusting an output of the DDS based on the indicator of the drift in the resonance frequency.

13. The oscillator of claim 8, wherein the phase lock loop further comprises a feedback divider having a divide ratio N, the feedback divider in communication with an input to the phase frequency detector for scaling down the mixer output to a scale of the reference signal based on the divide ratio N.

14. A method for compensating for resonance drift in an oscillator having a phase locked resonating oscillator, comprising:
maintaining a resonating oscillator in a phase lock with an external reference, the resonating oscillator comprising a resonator having a resonance frequency drifting in response to an environmental stimulus;
generating a drift compensation signal comprising a drift offset based on an indicator of a drift in the resonance frequency;
generating a mixer output for offsetting the drift in the resonance frequency based on mixing a resonating oscillator output with the drift compensation signal;
detecting a phase difference between the mixer output and the external reference, and
tuning operation of the resonating oscillator based on the detected phase difference to maintain operation of the resonating oscillator at the resonant frequency.

15. The method according to claim 14, further comprising generating a sideband offset for increasing a frequency separation between the mixer output and the resonating oscillator output, wherein the drift compensation signal further comprises the sideband offset.

16. A method for phase locking an oscillator, comprising:
operating an unlocked oscillator in an unlocked state, the unlocked oscillator configured to output at a resonance frequency configured to drift in response to changes in an operating environment;
generating a first mixer output from an output port of a first mixer, the first mixer output based on mixing the unlocked oscillator output with an output of a local oscillator, wherein the local oscillator has a tuning bandwidth selected to span a drift bandwidth of the unlocked oscillator;
generating a control signal using a phase frequency detector, the control signal based on a detected phase difference between a reference signal and the first mixer output, and
maintaining phase lock with the reference signal based on using the control signal generated by the phase frequency detector to adjust the output of the local oscillator to compensate for the resonance frequency drift of the unlocked oscillator when mixed with the unlocked oscillator output at the first mixer.

17. The method of claim 16, further comprising dividing the first mixer output, by a divide ratio N, using a feedback divider coupled between the phase frequency detector and the mixer.

* * * * *